(12) United States Patent
Yamaguchi

(10) Patent No.: US 11,678,079 B2
(45) Date of Patent: Jun. 13, 2023

(54) SOLID-STATE IMAGING ELEMENT, IMAGING APPARATUS, AND METHOD OF CONTROLLING SOLID-STATE IMAGING ELEMENT

(71) Applicant: SONY SEMICONDUCTOR SOLUTIONS CORPORATION, Kanagawa (JP)

(72) Inventor: Satoshi Yamaguchi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/597,085

(22) PCT Filed: Mar. 31, 2020

(86) PCT No.: PCT/JP2020/014730
§ 371 (c)(1),
(2) Date: Dec. 23, 2021

(87) PCT Pub. No.: WO2021/002071
PCT Pub. Date: Jan. 7, 2021

(65) Prior Publication Data
US 2022/0232177 A1 Jul. 21, 2022

(30) Foreign Application Priority Data
Jul. 3, 2019 (JP) .............................. JP2019-124126

(51) Int. Cl.
*H01L 27/144* (2006.01)
*H04N 25/53* (2023.01)
(Continued)

(52) U.S. Cl.
CPC .......... *H04N 25/53* (2023.01); *H04N 25/709* (2023.01); *H04N 25/75* (2023.01); *H04N 25/767* (2023.01); *H04N 25/778* (2023.01)

(58) Field of Classification Search
None
See application file for complete search history.

(56) References Cited

U.S. PATENT DOCUMENTS

| 2002/0122130 A1 | 9/2002 | Yamaguchi et al. |
| 2017/0207257 A1 | 7/2017 | Nishihara |
| (Continued) | | |

FOREIGN PATENT DOCUMENTS

| JP | 2005-260982 A | 9/2005 |
| JP | 2018-160485 A | 10/2018 |
| (Continued) | | |

OTHER PUBLICATIONS

International Search Report and Written Opinion of PCT Application No. PCT/JP2020/014730, dated May 26, 2020, 08 pages of ISRWO.

*Primary Examiner* — Mark T Monk
(74) *Attorney, Agent, or Firm* — Chip Law Group

(57) ABSTRACT

An object is to improve a frame rate in a solid-state imaging element that employs a global shutter method. In the solid-state imaging element, a photoelectric conversion element generates a charge by photoelectric conversion. A charge holding transistor holds the charge. A backward flow prevention transistor generates a potential barrier between the photoelectric conversion element and the charge holding transistor immediately after the charge is transferred from the photoelectric conversion element to the charge holding transistor. A floating diffusion layer accumulates the charge and generates a voltage corresponding to an amount of the (Continued)

charge. A transfer transistor transfers the charge from the charge holding transistor to the floating diffusion layer.

9 Claims, 28 Drawing Sheets

(51) Int. Cl.
  *H04N 25/75* (2023.01)
  *H04N 25/709* (2023.01)
  *H04N 25/767* (2023.01)
  *H04N 25/778* (2023.01)

(56) References Cited

U.S. PATENT DOCUMENTS

2018/0054579 A1   2/2018  Kumagai
2019/0014278 A1*  1/2019  Kumagai ............. H04N 25/778

FOREIGN PATENT DOCUMENTS

WO   2016/017305 A1   2/2016
WO   2016/158483 A1  10/2016

* cited by examiner

SOLID-STATE IMAGING ELEMENT, IMAGING APPARATUS, AND METHOD OF CONTROLLING SOLID-STATE IMAGING ELEMENT

CROSS REFERENCE TO RELATED APPLICATIONS

This application is a U.S. National Phase of International Patent Application No. PCT/JP2020/014730 filed on Mar. 31, 2020, which claims priority benefit of Japanese Patent Application No. JP 2019-124126 filed in the Japan Patent Office on Jul. 3, 2019. Each of the above-referenced applications is hereby incorporated herein by reference in its entirety.

TECHNICAL FIELD

The present technology relates to a solid-state imaging element, an imaging apparatus, and a method of controlling the solid-state imaging element. Specifically, the present technology relates to a solid-state imaging element that simultaneously exposes all pixels, an imaging apparatus, and a method of controlling the solid-state imaging element.

BACKGROUND ART

As a method of exposing a solid-state imaging element, there have been conventionally known a rolling shutter method of sequentially exposing rows and a global shutter method of simultaneously exposing all pixels. Of those methods, the latter global shutter method can accurately capture motion of a subject because an image is not distorted due to a difference in exposure timing of each row. In order to achieve this global shutter method, for example, there is proposed a solid-state imaging element in which a charge supplied from a photoelectric conversion element is temporarily held in a metal-oxide-semiconductor (MOS) capacitor for each pixel (see, for example, Patent Document 1). Further, in this solid-state imaging element, a column analog to digital converter (ADC) in which an ADC is arranged in each column is arranged at a subsequent stage of the pixels.

CITATION LIST

Patent Document

Patent Document 1: Japanese Patent Application Laid-Open No. 2018-160485

SUMMARY OF THE INVENTION

Problems to be Solved by the Invention

The solid-state imaging element described above simultaneously exposes all the pixels, causes the MOS capacitors to hold charges corresponding to an amount of exposure, and sequentially transfers the charges row by row from the MOS capacitors to floating diffusion layers, thereby achieving the global shutter method in a configuration of the column ADC. However, when the charges are transferred from the photoelectric conversion elements to the MOS capacitors, charges remaining in the MOS capacitors in the previous exposure may flow backward to the photoelectric conversion elements. In order to discharge those charges that have flowed backward, a scanning circuit needs to sweep the charges from the photoelectric conversion elements every time image data (in other words, a frame) is captured. At the time of sweeping the charges, potentials of a power supply and ground fluctuate. Therefore, it is necessary to wait for a start of the next exposure until the potentials are stabilized. Time required for this stabilization increases as the number of pixels of the solid-state imaging element increases. This causes a problem that improvement in frame rate becomes difficult as the number of pixels increases.

The present technology has been made in view of such a circumstance, and an object thereof is to improve a frame rate in a solid-state imaging element that employs the global shutter method.

Solutions to Problems

The present technology has been made to solve the above-described problems, and a first aspect thereof is a solid-state imaging element and a control method thereof, the solid-state imaging element including: a photoelectric conversion element that generates a charge by photoelectric conversion; a charge holding transistor that holds the charge; a backward flow prevention transistor that generates a potential barrier between the photoelectric conversion element and the charge holding transistor immediately after the charge is transferred from the photoelectric conversion element to the charge holding transistor; a floating diffusion layer that accumulates the charge and generates a voltage corresponding to an amount of the charge; and a transfer transistor that transfers the charge from the charge holding transistor to the floating diffusion layer. This makes it possible to prevent a backward flow from the charge holding transistor to the photoelectric conversion element.

Further, in the first aspect, there may be further provided a charge discharging transistor that discharges the charge from the photoelectric conversion element. This makes it possible to initialize the photoelectric conversion element.

Further, in the first aspect, there may be further provided a scanning circuit that controls the charge discharging transistor to discharge the charge immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing. This makes it possible to improve a frame rate.

Further, in the first aspect, there may be further provided: a reset transistor that discharges the charge from the floating diffusion layer; an amplifier transistor that amplifies the voltage; and a selection transistor that outputs a signal of the amplified voltage as a pixel signal in response to a predetermined selection signal. Therefore, the pixel signal can be read.

Further, in the first aspect, there may be further provided a column signal processing unit that processes the pixel signals supplied from each of a predetermined number of columns each including a plurality of pixels, and the photoelectric conversion element, the charge holding transistor, the backward flow prevention transistor, the floating diffusion layer, the transfer transistor, the charge discharging transistor, the reset transistor, the amplifier transistor, and the selection transistor may be arranged in each of the plurality of pixels. Therefore, the pixel signals can be read for each row.

Further, a second aspect of the present technology is an imaging apparatus including: a photoelectric conversion element that generates a charge by photoelectric conversion;

a charge holding transistor that holds the charge; a backward flow prevention transistor that generates a potential barrier between the photoelectric conversion element and the charge holding transistor immediately after the charge is transferred from the photoelectric conversion element to the charge holding transistor; a floating diffusion layer that accumulates the charge and generates a voltage corresponding to an amount of the charge; a transfer transistor that transfers the charge from the charge holding transistor to the floating diffusion layer; and a signal processing unit that processes image data including a pixel signal corresponding to the voltage. This makes it possible to process the pixel signal supplied from the pixel in which a backward flow from the charge holding transistor to the photoelectric conversion element is prevented.

Further, in the second aspect, there may be further provided: a charge discharging transistor that discharges the charge from the photoelectric conversion element; a scanning circuit that controls the charge discharging transistor to discharge the charge from the photoelectric conversion element immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing; a light emission control unit that causes a lighting device to emit light in response to a predetermined light emission enable signal; and a synchronization control unit that controls disabling the light emission enable signal during a predetermined exposure prohibition period immediately before the second or subsequent exposure start timing, and the scanning circuit may control the backward flow prevention transistor to transfer the charge during the exposure prohibition period. Therefore, emission of light can be restricted in the exposure prohibition period.

Further, in the second aspect, there may be further provided an optical system that opens and closes a mechanical shutter in response to a predetermined mechanical shutter enable signal, and the synchronization control unit may further control disabling the mechanical shutter enable signal during a transfer period of the charge in the exposure prohibition period. This makes it possible to close the mechanical shutter in the transfer period of the charge.

MODE FOR CARRYING OUT THE INVENTION

Hereinafter, modes for carrying out the present technology (hereinafter, referred to as "embodiments") will be described. Description will be made in the following order.

1. Embodiment (example of preventing backward flow to photoelectric conversion element)
2. Modification example
3. Examples of application to moving objects 1. Embodiment

[Configuration Example of Imaging Apparatus]

Figure 1:
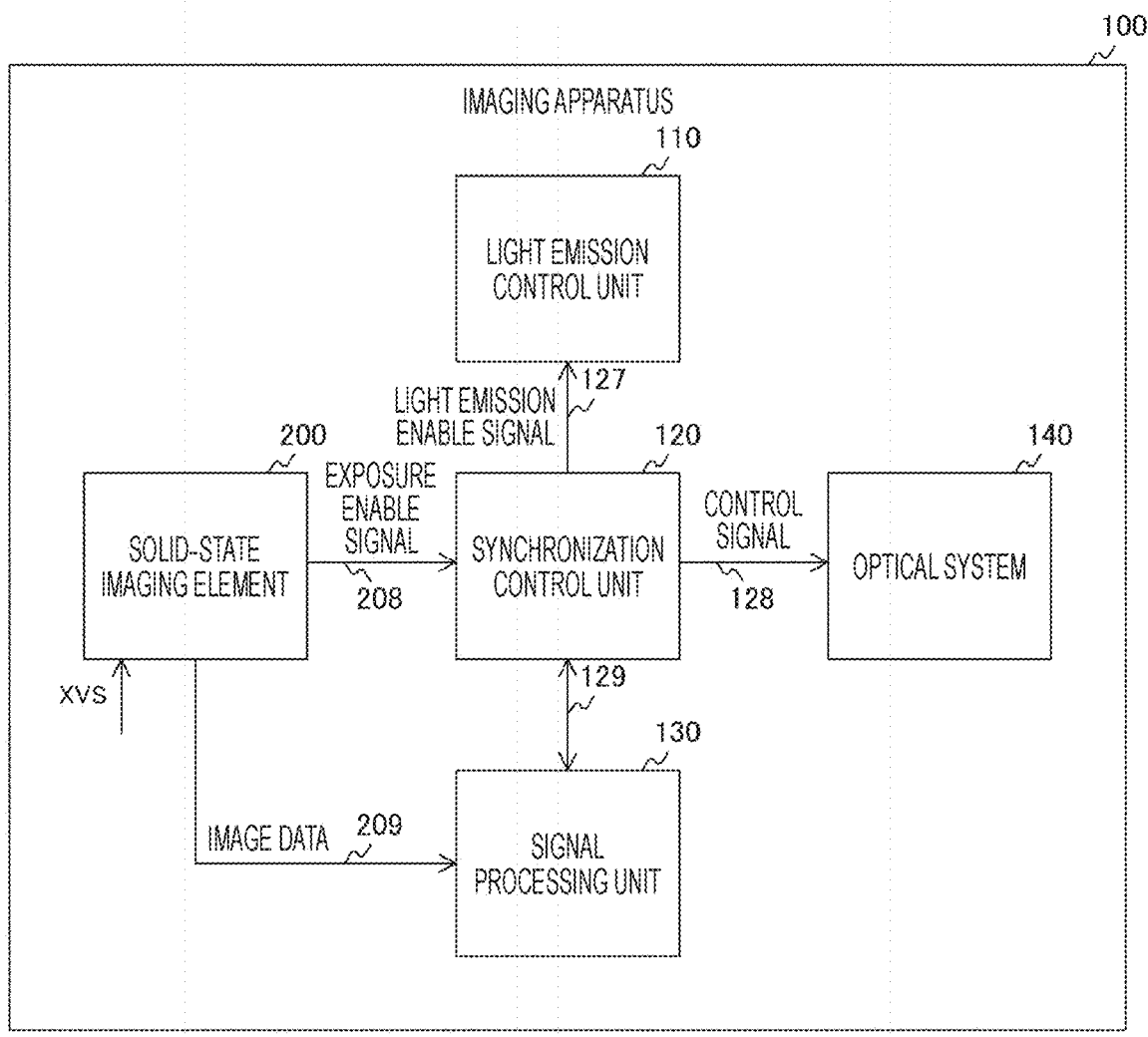
FIG. 1 is a block diagram showing a configuration example of an imaging apparatus in an embodiment of the present technology.

FIG. 1 is a block diagram showing a configuration example of an imaging apparatus 100 in an embodiment of the present technology. The imaging apparatus 100 is an apparatus for capturing image data and includes a solid-state imaging element 200, a light emission control unit 110, a synchronization control unit 120, a signal processing unit 130, and an optical system 140. The imaging apparatus 100 is used to, for example, detect the presence or absence of nano-sized dust in a clean room in a semiconductor element manufacturing factory or the like. The dust to be detected is also called particles.

The solid-state imaging element 200 captures image data in synchronization with a vertical synchronization signal XVS. Herein, the vertical synchronization signal XVS is a periodic signal indicating a timing to capture image data. The solid-state imaging element 200 supplies the captured image data to the signal processing unit 130 via a signal line 209. Further, the solid-state imaging element 200 generates an exposure enable signal and supplies the exposure enable signal to the synchronization control unit 120 via a signal line 208. The exposure enable signal is a signal indicating an exposable period during which pixels of the solid-state imaging element 200 can be exposed.

The synchronization control unit 120 controls the light emission control unit 110, the signal processing unit 130, and the optical system 140. The synchronization control unit 120 generates a light emission enable signal in synchronization with the exposure enable signal and supplies the light emission enable signal to the light emission control unit 110 via a signal line 127. The light emission enable signal is a signal indicating a period during which an external lighting device (not shown) such as a strobe can emit light.

Further, the synchronization control unit 120 generates a control signal for controlling an aperture value and a position of a lens and supplies the control signal to the optical system 140 via a signal line 128. Further, the synchronization control unit 120 exchanges data such as a control signal with the signal processing unit 130 via a signal line 129.

The light emission control unit 110 causes the external lighting device to emit light in response to the light emission enable signal.

The optical system 140 collects light from a subject and guides the light to the solid-state imaging element 200. The optical system 140 includes optical components such as a plurality of lenses and a diaphragm.

The signal processing unit 130 performs predetermined image processing on the image data supplied from the solid-state imaging element 200. For example, the signal processing unit 130 holds the input image data and performs processing of obtaining a difference image between the held past image data and current image data input next. Then, the signal processing unit 130 detects the presence or absence of particles on the basis of the difference image and outputs a detection result. Note that the signal processing unit 130 can also perform image processing other than the processing of detecting the presence or absence of particles.

Note that the solid-state imaging element 200 is applied to the imaging apparatus 100 for inspection in a manufacturing factory, but is not limited to this configuration. For example, the solid-state imaging element 200 is applicable to a digital camera such as a digital still camera, a smartphone, a personal computer, an in-vehicle camera, and the like.

[Configuration Example of Solid-State Imaging Element]

Figure 2:
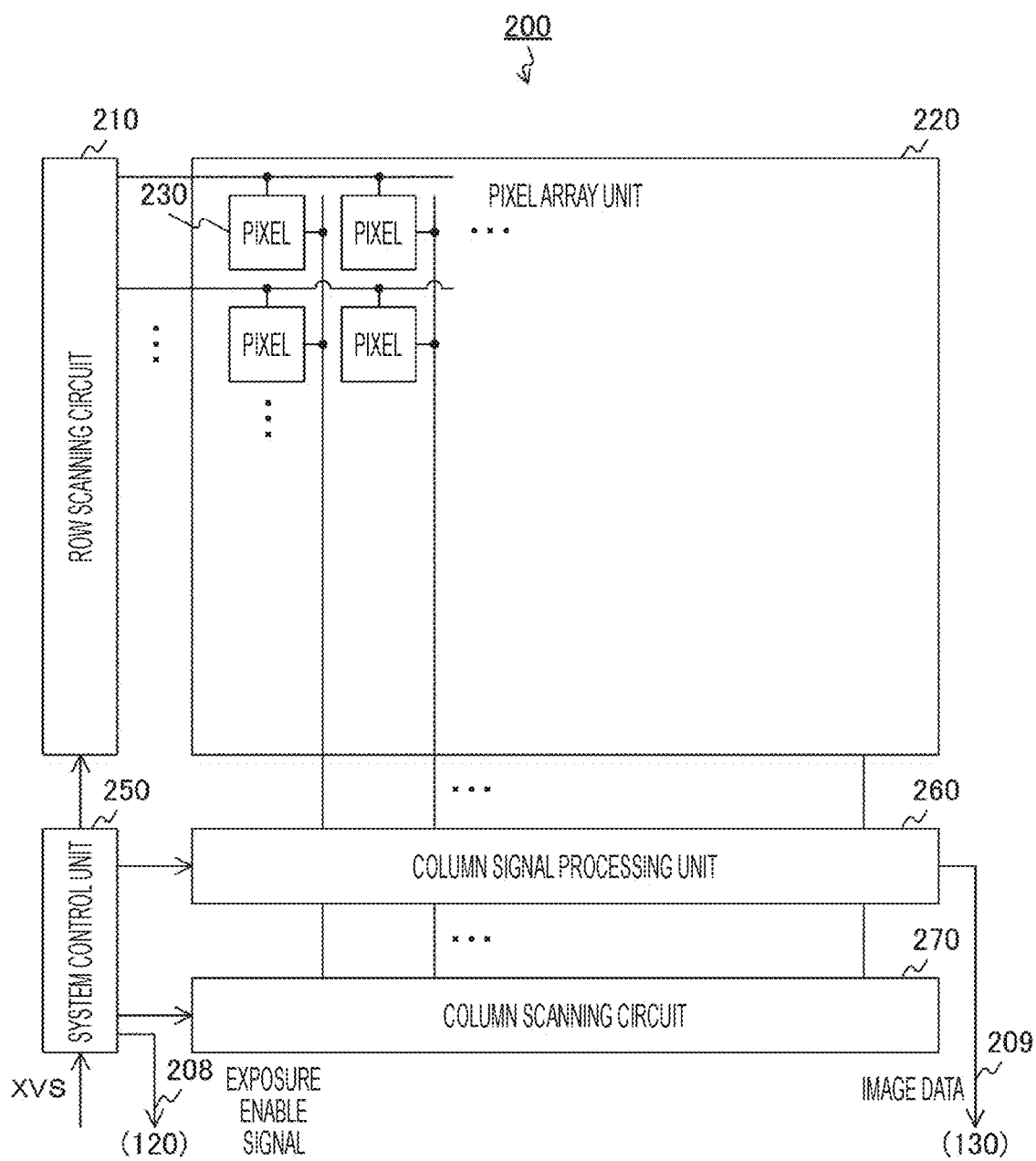
FIG. 2 is a block diagram showing a configuration example of a solid-state imaging element in the embodiment of the present technology.

FIG. 2 is a block diagram showing a configuration example of the solid-state imaging element 200 in the embodiment of the present technology. The solid-state imaging element 200 includes a row scanning circuit 210, a pixel array unit 220, a system control unit 250, a column signal processing unit 260, and a column scanning circuit 270.

In the pixel array unit 220, a plurality of pixels 230 is arrayed in a two-dimensional lattice. Hereinafter, a set of pixels 230 arrayed in a predetermined horizontal direction will be referred to as "row", and a set of pixels 230 arrayed in a direction perpendicular to the row will be referred to as "column".

The row scanning circuit 210 simultaneously exposes all the pixels and sequentially drives the pixels row by row to cause the pixels to output pixel signals.

The system control unit 250 controls respective operation timings of the row scanning circuit 210, the column signal processing unit 260, and the column scanning circuit 270 in synchronization with the vertical synchronization signal XVS. Further, the system control unit 250 generates an exposure enable signal and supplies the exposure enable signal to the synchronization control unit 120.

The column signal processing unit 260 performs signal processing, such as analog to digital (AD) conversion processing and correlated double sampling (CDS) processing, on the pixel signals in each column. The column signal processing unit 260 supplies image data including the processed digital signals to the signal processing unit 130.

The column scanning circuit 270 controls the column signal processing unit 260 to sequentially output pixel data.

[Configuration Example of Pixel]

Figure 3:
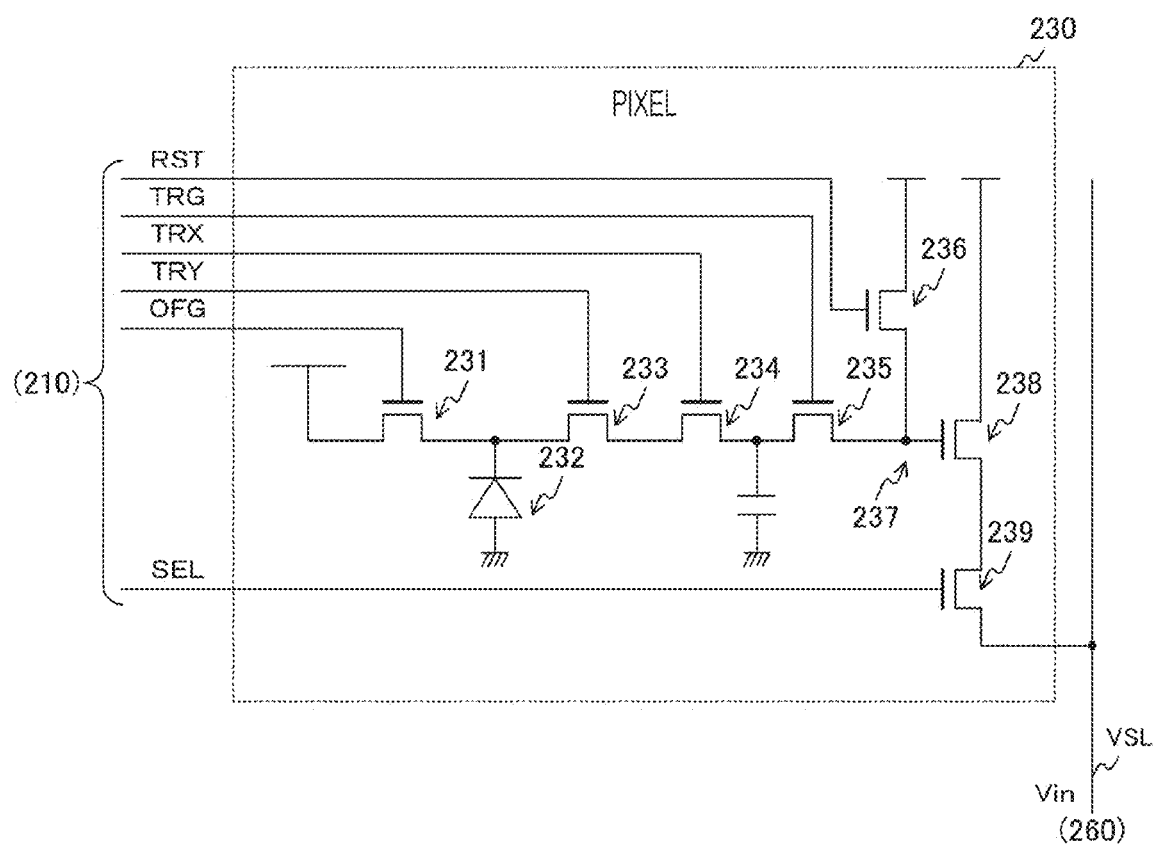
FIG. 3 is a circuit diagram showing a configuration example of a pixel in the embodiment of the present technology.

FIG. 3 is a circuit diagram showing a configuration example of the pixel 230 in the embodiment of the present technology. The pixel 230 includes a charge discharging transistor 231, a photoelectric conversion element 232, a backward flow prevention transistor 233, a charge holding transistor 234, and a transfer transistor 235. Further, the pixel 230 further includes a reset transistor 236, a floating diffusion layer 237, an amplifier transistor 238, and a selection transistor 239.

The charge discharging transistor 231 discharges a charge from the photoelectric conversion element 232 via an overflow gate in response to a reset signal OFG supplied from the row scanning circuit 210. With this discharge of the charge, an amount of charge of the photoelectric conversion element 232 is initialized.

The photoelectric conversion element 232 generates a charge by photoelectric conversion. The photoelectric conversion element 232 is, for example, a photodiode.

The backward flow prevention transistor 233 transitions to an on state in response to a transfer signal TRY supplied from the row scanning circuit 210 and transfers a charge from the photoelectric conversion element 232 to the charge holding transistor 234. Further, the backward flow prevention transistor 233 transitions to an off state immediately after transferring the charge. Therefore, a potential barrier is generated between the photoelectric conversion element 232 and the charge holding transistor 234. This prevents a backward flow of the charge from the charge holding transistor 234 to the photoelectric conversion element 232.

The charge holding transistor 234 is a MOS transistor including a MOS capacitor for holding a charge. The charge holding transistor 234 opens a gate in response to a transfer signal TRX supplied from the row scanning circuit 210, transfers a charge to its own MOS capacitor, and holds the charge. Because the MOS capacitor is provided, the charge can be held in the MOS capacitor immediately after the exposure of all the pixels ends until the corresponding row is read. Therefore, the global shutter method can be achieved in a configuration of a column ADC.

The transfer transistor 235 transfers a charge from the charge holding transistor 234 to the floating diffusion layer 237 in response to a transfer signal TRG supplied from the row scanning circuit 210.

The reset transistor 236 discharges a charge from the floating diffusion layer 237 in response to a reset signal RST supplied from the row scanning circuit 210. With this discharge of the charge, an amount of charge of the floating diffusion layer 237 is initialized.

The floating diffusion layer 237 accumulates the transferred charge and generates a voltage corresponding to the amount of charge.

The amplifier transistor 238 amplifies the voltage of the floating diffusion layer 237. In response to a selection signal SEL supplied from the row scanning circuit 210, the selection transistor 239 outputs an analog signal of the amplified voltage as a pixel signal Vin to the column signal processing unit 260 via a vertical signal line VSL. The vertical signal line VSL is wired for each column in the pixel array unit 220.

[Configuration Example of Column Signal Processing Unit]

Figure 4:
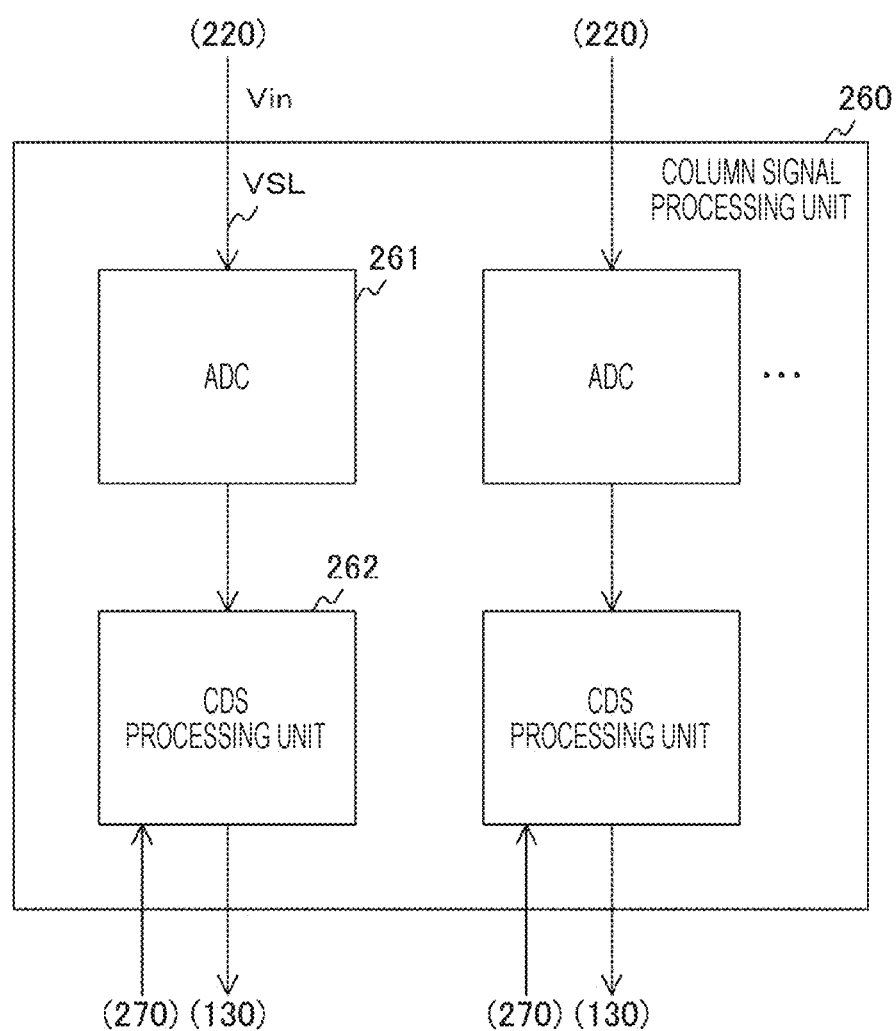
FIG. 4 is a block diagram showing a configuration example of a column signal processing unit in the embodiment of the present technology.

FIG. 4 is a block diagram showing a configuration example of the column signal processing unit 260 in the embodiment of the present technology. The column signal processing unit 260 includes an analog to digital converter (ADC) 261 and a CDS processing unit 262 for each column.

The ADC 261 converts an analog signal (i.e., a pixel signal) supplied from a corresponding column into a digital signal. The ADC 261 supplies the digital signal to the CDS processing unit 262.

The CDS processing unit 262 performs, on the digital signal, CDS processing of obtaining a difference between a reset level and a signal level. Herein, the reset level is a level of a digital signal when the floating diffusion layer 237 is initialized. Further, the signal level is a level of a digital signal when a charge corresponding to an amount of exposure is transferred to the floating diffusion layer 237. The CDS processing unit 262 outputs the processed digital signal to the signal processing unit 130 under the control of the column scanning circuit 270.

Note that, although the CDS processing unit 262 executes the CDS processing, the ADC 261 may further execute the CDS processing in addition to AD conversion processing.

[Operation Example of Imaging Apparatus]

Figure 5:
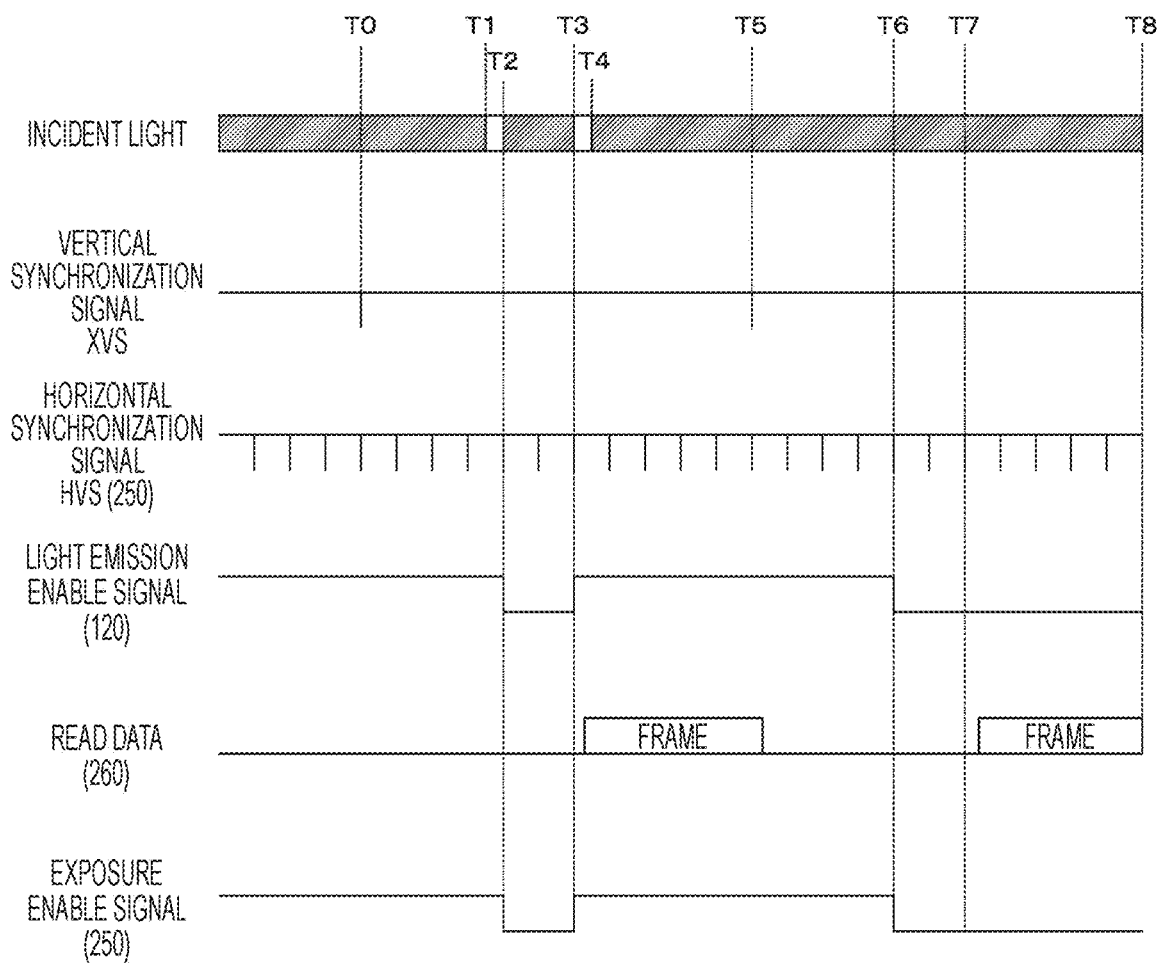
FIG. 5 is a timing chart showing an example of operation of an imaging apparatus in the embodiment of the present technology.

FIG. 5 is a timing chart showing an example of operation of the imaging apparatus 100 in the embodiment of the present technology. The vertical synchronization signal XVS falls at timings T0 and T5.

Each pixel in the solid-state imaging element 200 transfers a charge from the photoelectric conversion element 232 to the charge holding transistor 234 within a period from a timing T2 to a timing T3. When exposure is performed within this transfer period, the charge may leak into the next image data (in other words, frame). Therefore, the system control unit 250 in the solid-state imaging element 200 disables (e.g., low level) the exposure enable signal within the transfer period from the timing T2 to the timing T3 to prohibit exposure. In a period after a timing T6, the exposure enable signal is set to be disabled because a charge supplied from the photoelectric conversion element 232 is swept and a charge is transferred. However, this disabled period after the timing T6 is set longer than the period from the timing T2 to the timing T3 because not only transferring a charge but also sweeping a charge is executed.

The synchronization control unit 120 enables (e.g., high level) the light emission enable signal within an exposable period in which the exposure enable signal is enabled (e.g., high level) and disables (e.g., low level) the light emission enable signal within an exposure prohibition period in which the exposure enable signal is disabled.

The light emission control unit 110 causes the lighting device to emit light at a predetermined timing within the period in which the light emission enable signal is enabled (i.e., the exposable period). Meanwhile, the light emission control unit 110 turns off the lighting device within the period in which the light emission enable signal is disabled (i.e., within the exposure prohibition period) to restrict light emission operation. For example, the lighting device emits light within a period from the timing T1 to the timing T2 and a period from the timing T3 to a timing T4 in the exposable period.

The row scanning circuit 210 sequentially selects rows in synchronization with a horizontal synchronization signal HVS and causes the rows to output pixel signals. The column signal processing unit 260 AD converts the pixel signals in each row and reads image data (frame) immediately after the timing T3. However, this frame is discarded. Then, the column signal processing unit 260 reads the next frame immediately after a timing T7. This frame is a frame generated by first exposure.

Figure 6:
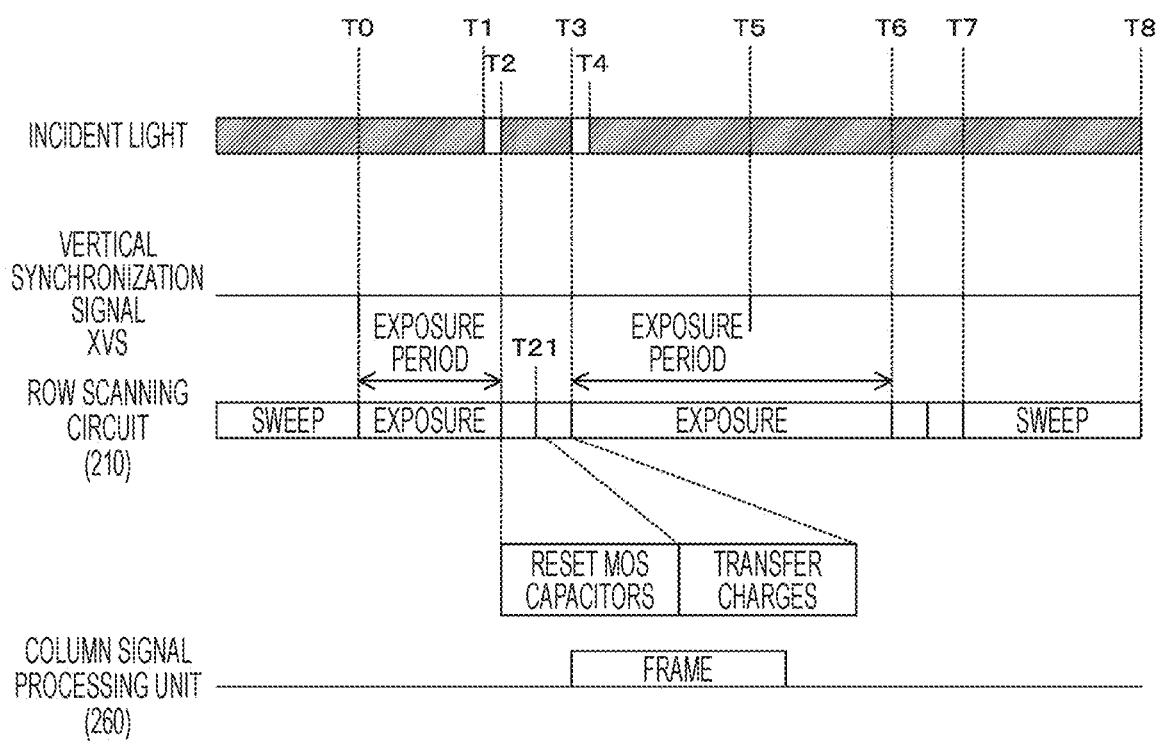
FIG. 6 is a timing chart showing an example of operation of a solid-state imaging element in the embodiment of the present technology.

FIG. 6 is a timing chart showing an example of operation of the solid-state imaging element 200 in the embodiment of the present technology. For example, a period from the timing T0 to the timing T2 is set as a first exposure period.

The row scanning circuit 210 in the solid-state imaging element 200 supplies the reset signal OFG to all the pixels immediately before the timing T0 to cause the pixels to sweep charges in the photoelectric conversion elements 232. Therefore, the photoelectric conversion elements 232 are initialized, and, at the timing T0, unnecessary charges are discharged and exposure of all the pixels is started. Then, the exposure of all the pixels ends at the timing T2.

Further, immediately before the exposure end timing T2, the row scanning circuit 210 AD converts (in other words, reads) signal levels in a first row. Within a period between the timing T2 and a timing T21, the column signal processing unit 260 reads reset levels in the first row. The second and subsequent rows are sequentially read in synchronization with the horizontal synchronization signal HVS.

Then, at the timing T21 immediately after the exposure ends, the row scanning circuit 210 supplies the transfer signals TRX and TRY to all the pixels to transfer charges corresponding to an amount of exposure from the photoelectric conversion elements 232 to the MOS capacitors. Then, after the timing T3, a frame including digital signals subjected to the CDS processing is output. Further, second exposure is performed at the same time as the reading.

As shown in FIG. 6, the solid-state imaging element 200 captures an image by the global shutter method of simultaneously exposing all pixels.

Next, potential diagrams of the operating pixel 230 of the solid-state imaging element 200 shown in FIG. 6 will be described.

Figure 7A:
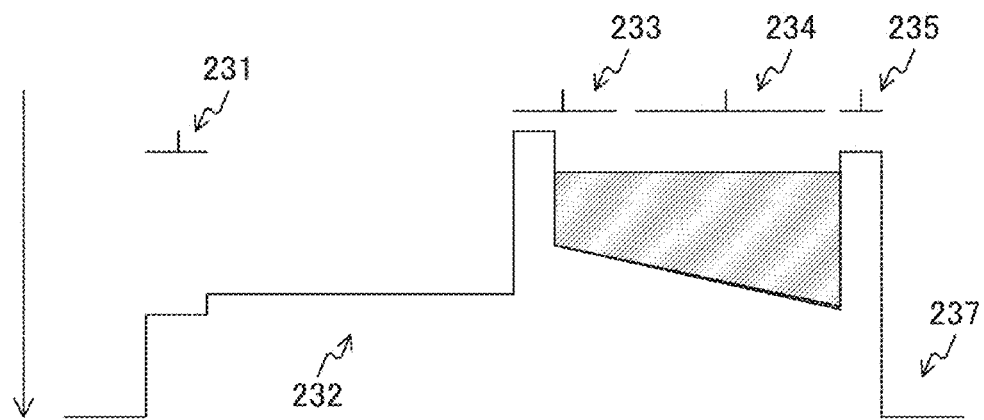
FIGS. 7A, 7B, and 7C illustrate exemplary potential diagrams of a pixel at the time of discharging a charge and during first exposure in the embodiment of the present technology.
Figure 7B:
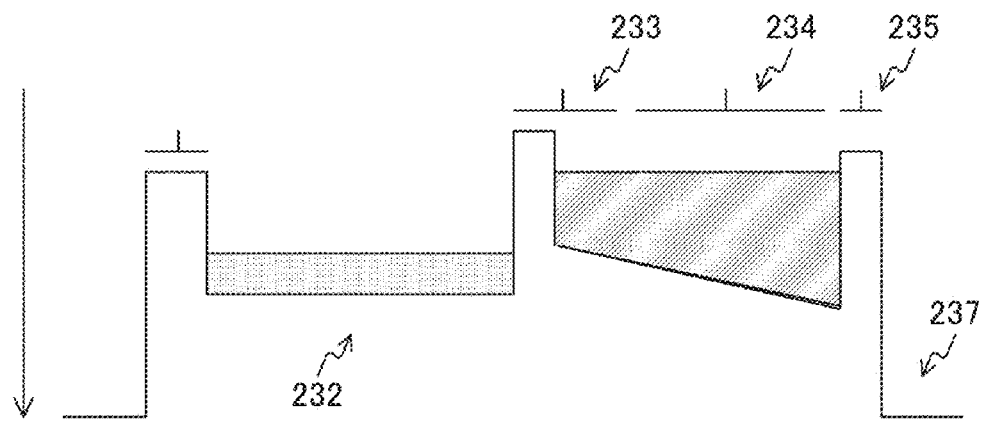
Figure 7C:
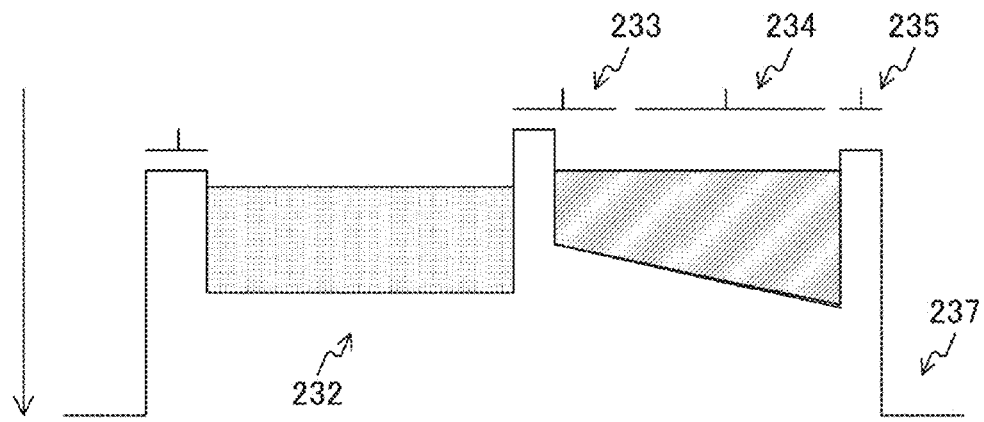

FIGS. 7A, 7B, and 7C illustrate exemplary potential diagrams of the pixel 230 at the time of discharging a charge and during the first exposure in the embodiment of the present technology. FIG. 7A illustrates an exemplary potential diagram of the pixel 230 at the time of discharging a charge. FIG. 7B illustrates an exemplary potential diagram of the pixel 230 immediately after the exposure starts. FIG. 7C illustrates an exemplary potential diagram of the pixel 230 during the exposure. Further, in FIGS. 7A, 7B, and 7C, directions of arrows indicate a direction in which a potential increases. The same applies to FIGS. 8A, 8B, and 8C and the subsequent drawings.

As illustrated in FIG. 7A, immediately before the first exposure starts, the charge discharging transistor 231 transitions to an on state during a certain pulse period under the control of the row scanning circuit 210 and sweeps a charge from the photoelectric conversion element 232. Therefore, the photoelectric conversion element 232 is initialized. Note that, at this point, a certain amount of charge is assumed to be accumulated in the floating diffusion layer 237. An area of a hatched part in FIGS. 7A 7B, and 7C indicates the amount of charge in the floating diffusion layer 237.

As illustrated in FIG. 7B, when the exposure starts, the photoelectric conversion element 232 generates a charge. An area of a gray part in FIGS. 7A, 7B, and 7C indicates an amount of charge generated by the first exposure. Then, as illustrated in FIG. 7C, the amount of charge in the photoelectric conversion element 232 increases according to an exposure time.

Figure 8A:
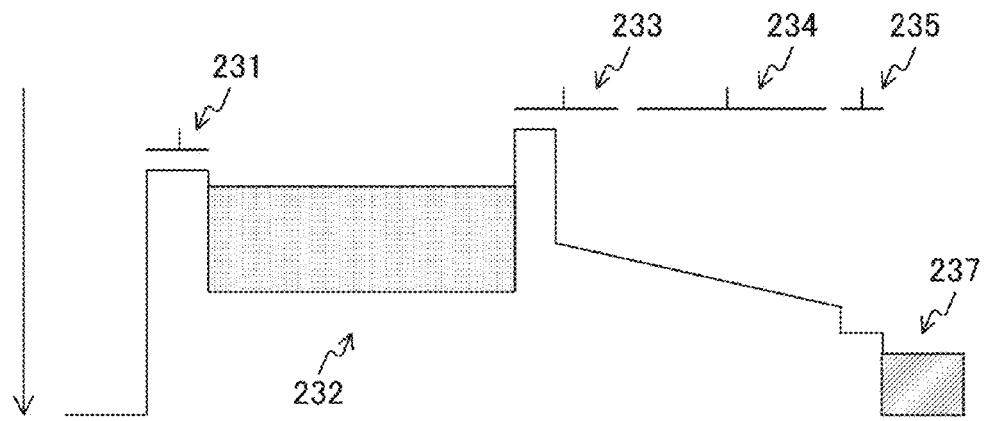
FIGS. 8A, 8B, and 8C illustrate exemplary potential diagrams of a pixel at the time of transferring a charge to a floating diffusion layer and at the time of initializing the floating diffusion layer in the embodiment of the present technology.
Figure 8B:
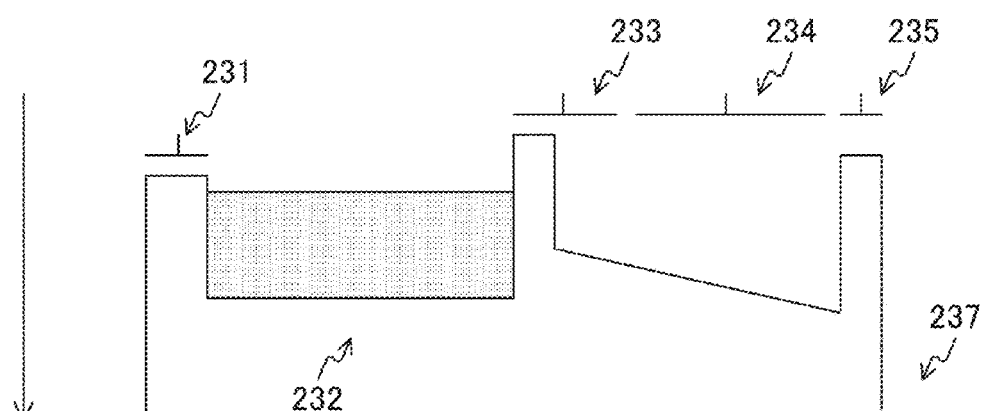
Figure 8C:
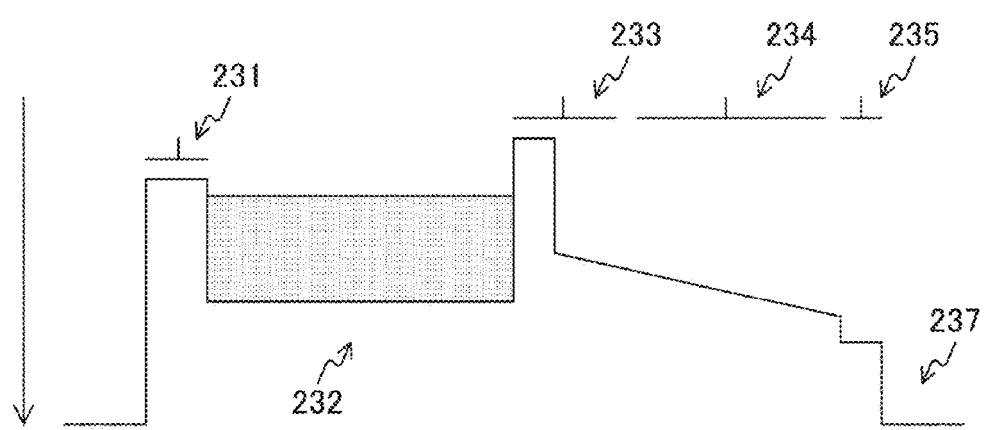

FIGS. 8A, 8B, and 8C illustrate exemplary potential diagrams of the pixel 230 at the time of transferring a charge to the floating diffusion layer 237 and at the time of initializing the floating diffusion layer 237 in the embodiment of the present technology. FIG. 8A illustrates an exemplary potential diagram of the pixel 230 at the time of transferring a charge to the floating diffusion layer 237. FIG. 8B illustrates an exemplary potential diagram of the pixel 230 immediately after transferring the charge to the floating diffusion layer 237. FIG. 8C illustrates an exemplary potential diagram of the pixel 230 at the time of initializing the floating diffusion layer 237.

As illustrated in FIG. 8A, immediately before an exposure end timing, the transfer transistor 235 transitions to an on state during the pulse period under the control of the row scanning circuit 210 and transfers a charge from the charge holding transistor 234 to the floating diffusion layer 237. At this time, in the first row, a potential of the floating diffusion layer 237 corresponding to the amount of charge is read as the signal level.

Then, as illustrated in FIG. 8B, the transfer transistor 235 transitions to an off state.

Subsequently, as illustrated in FIG. 8C, the transfer transistor 235 and the reset transistor 236 (not illustrated) transition to an on state during the pulse period under the control of the row scanning circuit 210 and sweep the charge from the floating diffusion layer 237. Therefore, the floating diffusion layer 237 is initialized. At this time, in the first row, the potential of the floating diffusion layer 237 at the time of initialization is read as the reset level.

Figure 9A:
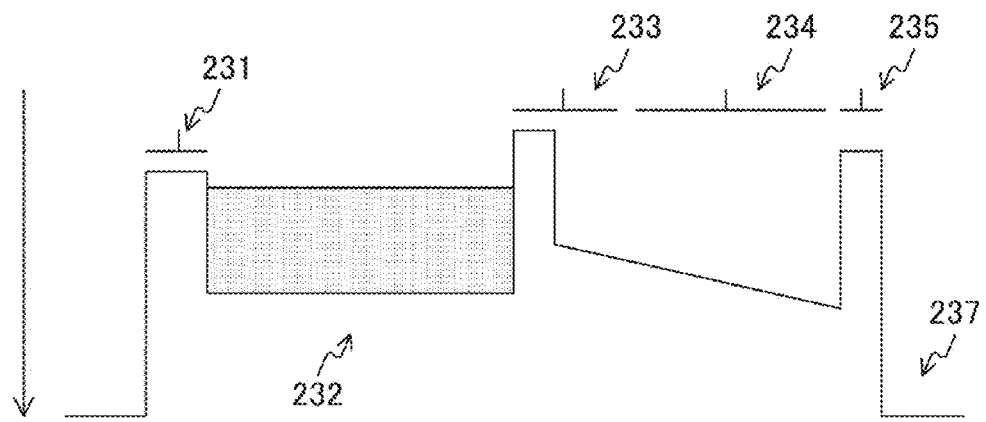
FIGS. 9A, 9B, and 9C illustrate exemplary potential diagrams of a pixel immediately after initialization and at the time of transferring a charge to a MOS capacitor in the embodiment of the present technology.
Figure 9B:
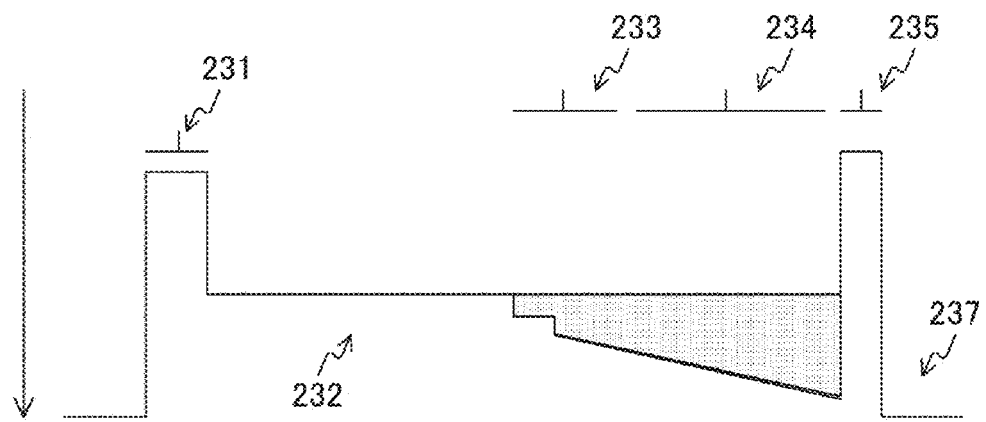
Figure 9C:
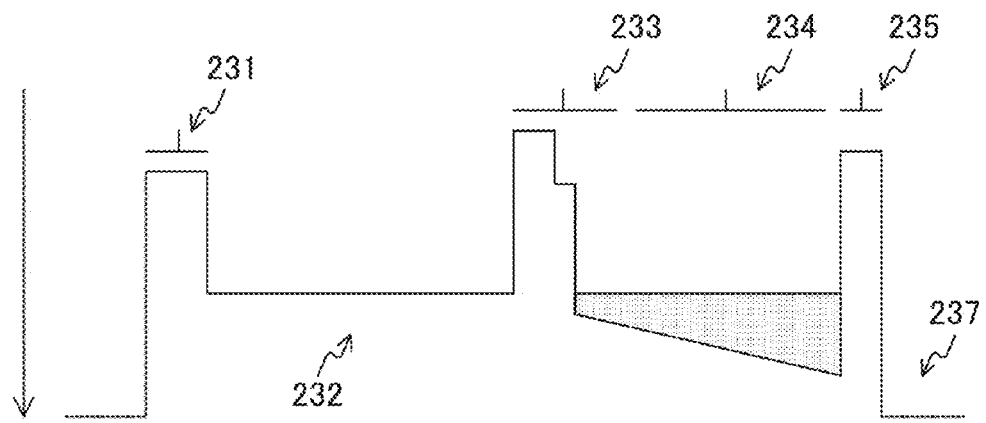

FIGS. 9A, 9B, and 9C illustrate exemplary potential diagrams of the pixel 230 immediately after initialization and at the time of transferring a charge to the MOS capacitor in the embodiment of the present technology. FIG. 9A illustrates an exemplary potential diagram of the pixel 230 immediately after initializing the floating diffusion layer 237. FIG. 9B illustrates an exemplary potential diagram of the pixel 230 at the time of transferring a charge to the MOS capacitor. FIG. 9C illustrates an exemplary potential diagram of the pixel 230 immediately after transferring the charge to the MOS capacitor.

As illustrated in FIG. 9A, immediately after the floating diffusion layer 237 is initialized, the transfer transistor 235 and the reset transistor 236 (not illustrated) transition to an off state.

Then, as illustrated in FIG. 9B, immediately after the exposure ends, the backward flow prevention transistor 233 and the charge holding transistor 234 transition to an on state during the pulse period under the control of the row scanning circuit 210. Therefore, a charge is transferred from the photoelectric conversion element 232 to the MOS capacitor of the charge holding transistor 234.

Then, as illustrated in FIG. 9C, the backward flow prevention transistor 233 and the charge holding transistor 234 transition to an off state. Because the backward flow prevention transistor 233 transitions to the off state, a potential barrier is generated between the photoelectric conversion element 232 and the charge holding transistor 234. This potential barrier prevents a backward flow of the charge from the charge holding transistor 234 to the photoelectric conversion element 232.

Because the backward flow to the photoelectric conversion element 232 is prevented, the photoelectric conversion element 232 is in an initialized state immediately after a first exposure end timing. Therefore, the charge discharging transistor 231 does not need to sweep a charge immediately before the second or subsequent exposure start timing.

Figure 10A:
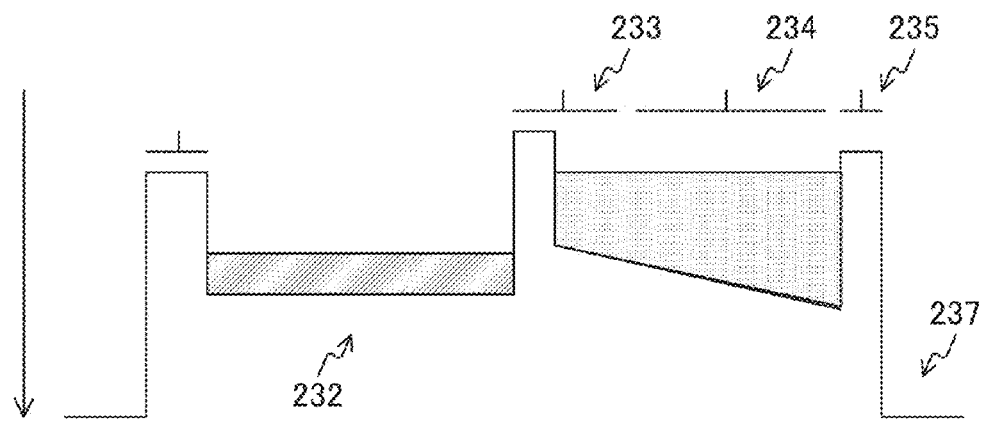
FIGS. 10A, 10B, and 10C illustrate exemplary potential diagrams of a pixel during second exposure and at the time of transferring a charge to a floating diffusion layer in the embodiment of the present technology.
Figure 10B:
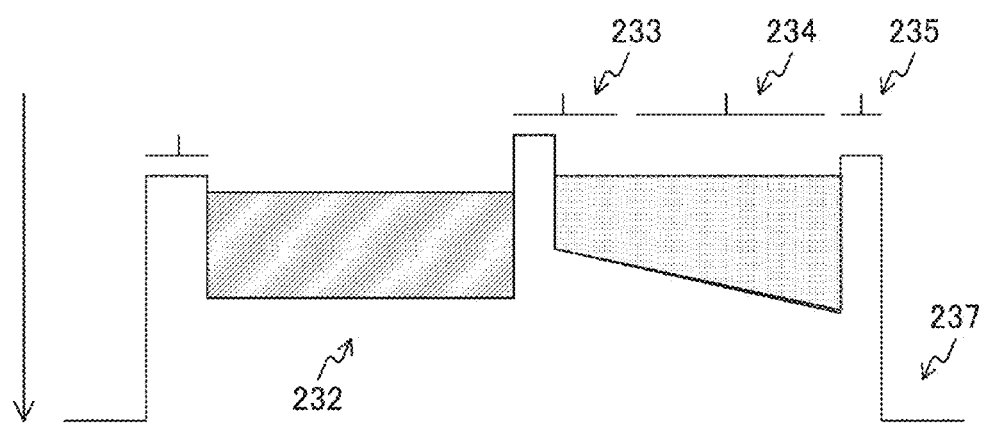
Figure 10C:
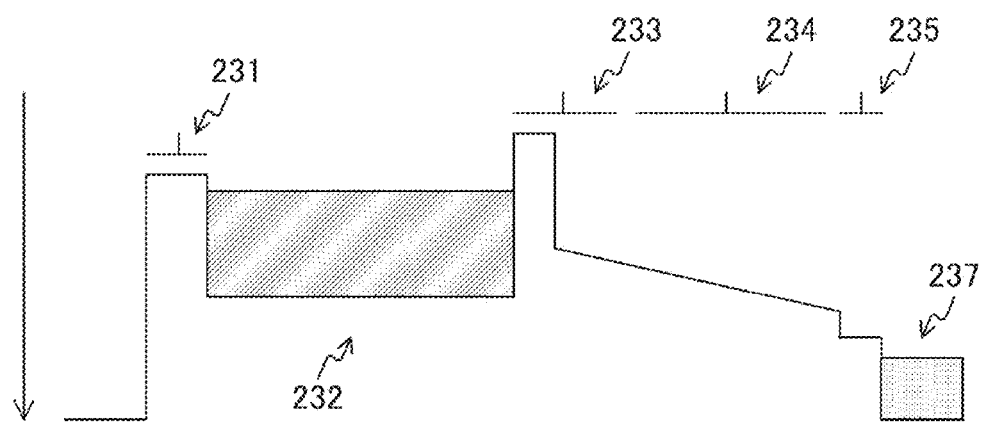

FIGS. 10A, 10B, and 10C illustrate exemplary potential diagrams of the pixel 230 during the second exposure and at the time of transferring a charge to the floating diffusion layer 237 in the embodiment of the present technology. FIG. 10A illustrates an exemplary potential diagram of the pixel 230 immediately after the second exposure. FIG. 10B illustrates an exemplary potential diagram of the pixel 230 during the second exposure. FIG. 10C illustrates an exemplary potential diagram of the pixel 230 at the time of transferring a charge to the floating diffusion layer 237.

As illustrated in a simultaneously, when the second exposure starts, the photoelectric conversion element 232 generates a charge. An area of a hatched part in FIGS. 10A, 10B, and 10C indicates an amount of charge generated by the second exposure. Then, as illustrated in FIG. 10B, the amount of charge in the photoelectric conversion element 232 increases according to an exposure time.

Subsequently, as illustrated in FIG. 10C, immediately before a second exposure end timing, the transfer transistor 235 transfers a charge from the charge holding transistor 234 to the floating diffusion layer 237. At this time, in the first row, the potential of the floating diffusion layer 237 corresponding to the amount of charge is read as the signal level. This signal level is a level corresponding to the amount of first exposure. That is, output of the frame generated by the first exposure is started during the second exposure.

Figure 11A:
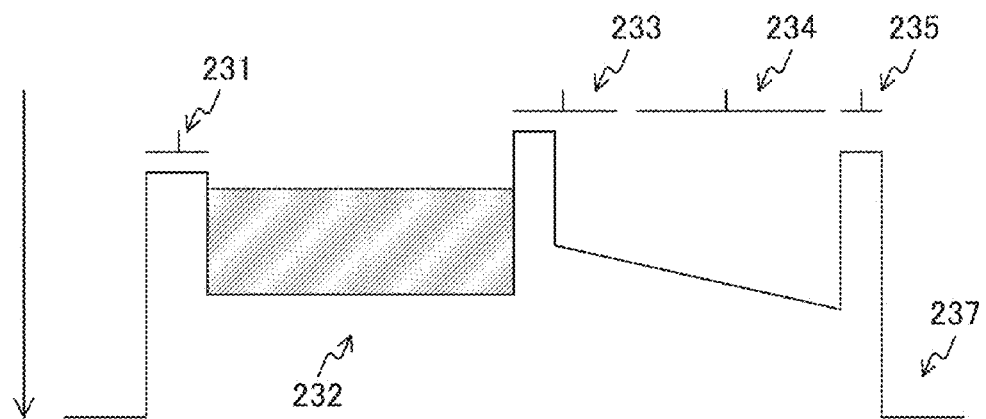
FIGS. 11A, 11B, and 11C illustrate exemplary potential diagrams of a pixel at the time of initializing a floating diffusion layer in a first embodiment of the present technology.
Figure 11B:
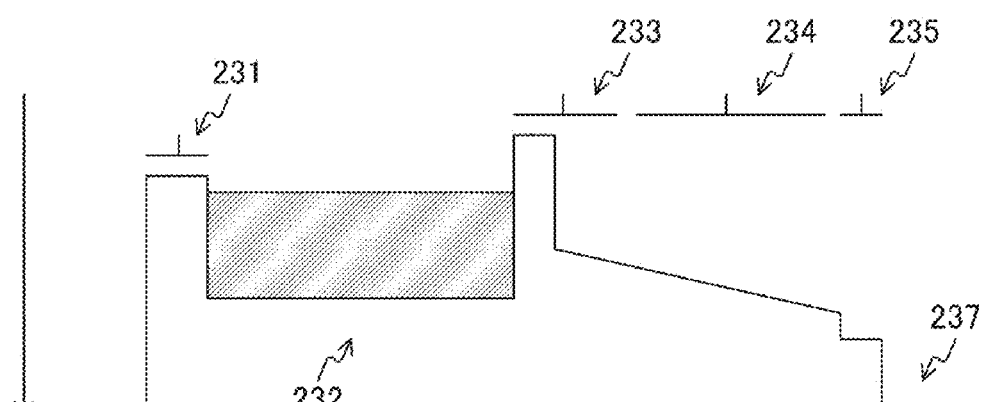
Figure 11C:
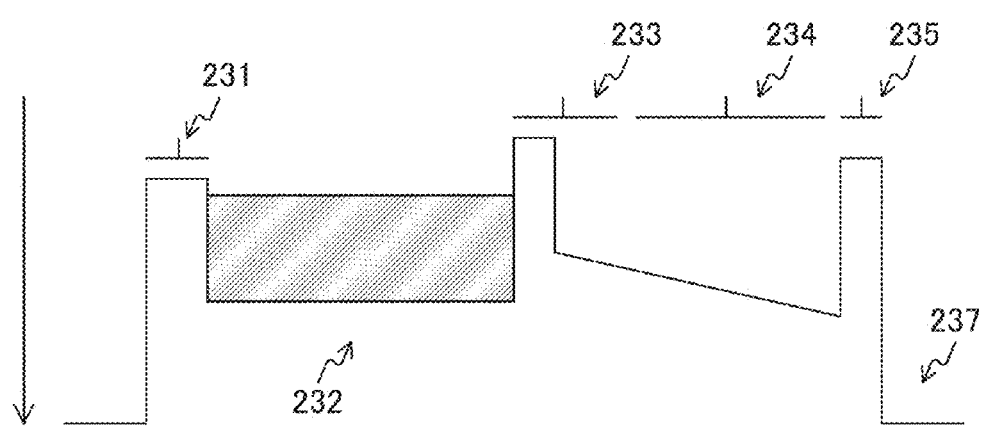

FIGS. 11A, 11B, and 11C illustrate exemplary potential diagrams of the pixel 230 at the time of initializing the floating diffusion layer 237 in a first embodiment of the present technology. FIG. 11A illustrates an exemplary potential diagram of the pixel 230 immediately after transferring a charge to the floating diffusion layer 237. FIG. 11B illustrates an exemplary potential diagram of the pixel 230 at the time of initializing the floating diffusion layer 237. FIG. 11C illustrates an exemplary potential diagram of the pixel 230 immediately after the initialization.

As illustrated in FIG. 11A, immediately after transferring a charge to the floating diffusion layer 237, the transfer transistor 235 transitions to an off state.

Then, as illustrated in FIG. 11B, the transfer transistor 235 and the reset transistor 236 (not illustrated) transition to an on state and sweep the charge from the floating diffusion layer 237. Therefore, the floating diffusion layer 237 is initialized. At this time, in the first row, the potential of the floating diffusion layer 237 at the time of initialization is read as the reset level.

As illustrated in FIG. 11C, immediately after the floating diffusion layer 237 is initialized, the transfer transistor 235 and the reset transistor 236 (not illustrated) transition to an off state.

Figure 12A:
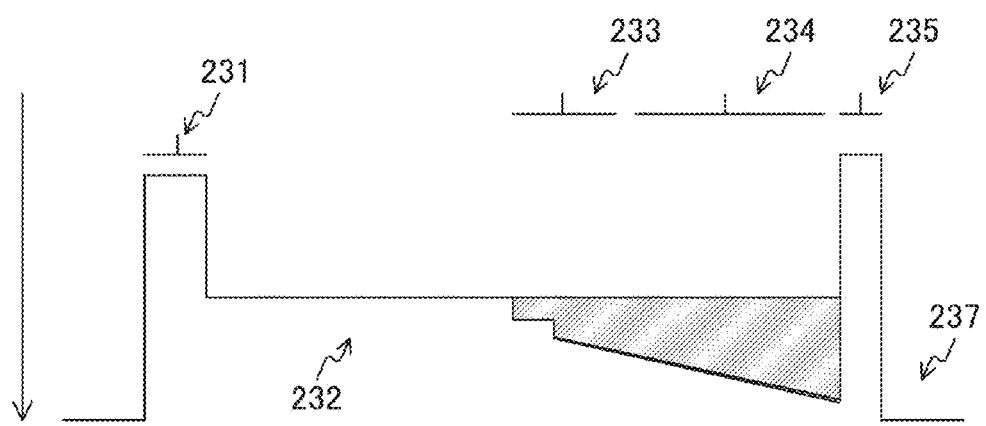
FIGS. 12A and 12B illustrates exemplary potential diagrams of a pixel at the time of transferring a charge to a MOS capacitor in the embodiment of the present technology.
Figure 12B:
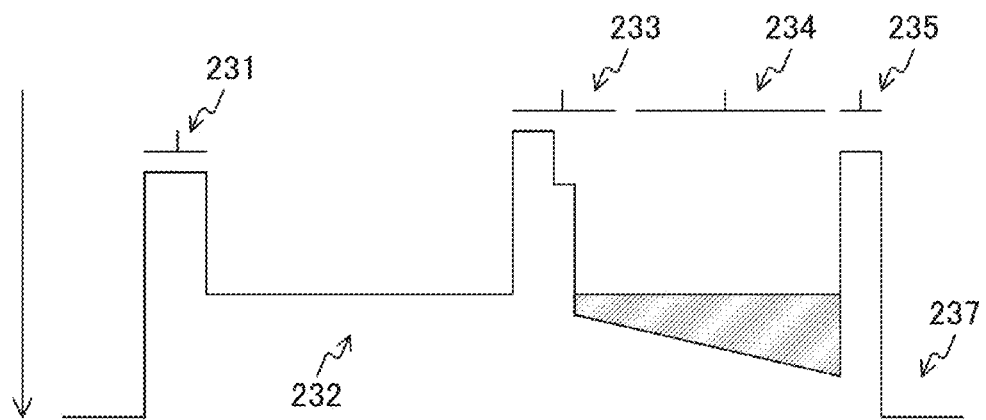

FIGS. 12A and 12B illustrate exemplary potential diagrams of the pixel 230 at the time of transferring a charge to the MOS capacitor in the embodiment of the present technology. FIG. 12A illustrates an exemplary potential diagram of the pixel 230 at the time of transferring a charge to the MOS capacitor. FIG. 12B illustrates an exemplary potential diagram of the pixel 230 immediately after transferring the charge to the MOS capacitor.

As illustrated in FIG. 12A, immediately after the exposure ends, the backward flow prevention transistor 233 and the charge holding transistor 234 transition to an on state. Therefore, a charge is transferred from the photoelectric conversion element 232 to the MOS capacitor.

Then, as illustrated in FIG. 12B, the backward flow prevention transistor 233 and the charge holding transistor 234 transition to an off state.

Figure 13A:
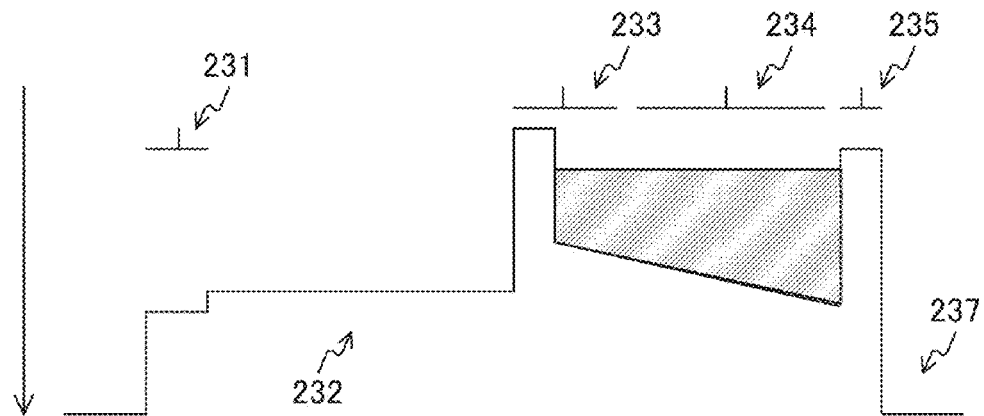
FIGS. 13A, 13B, and 13C illustrate exemplary potential diagrams of a pixel at the time of discharging a charge and during third exposure in the embodiment of the present technology.
Figure 13B:
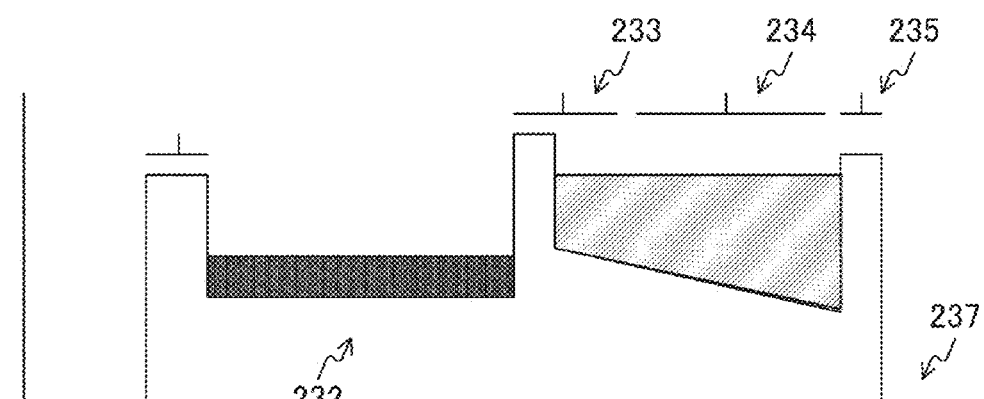
Figure 13C:
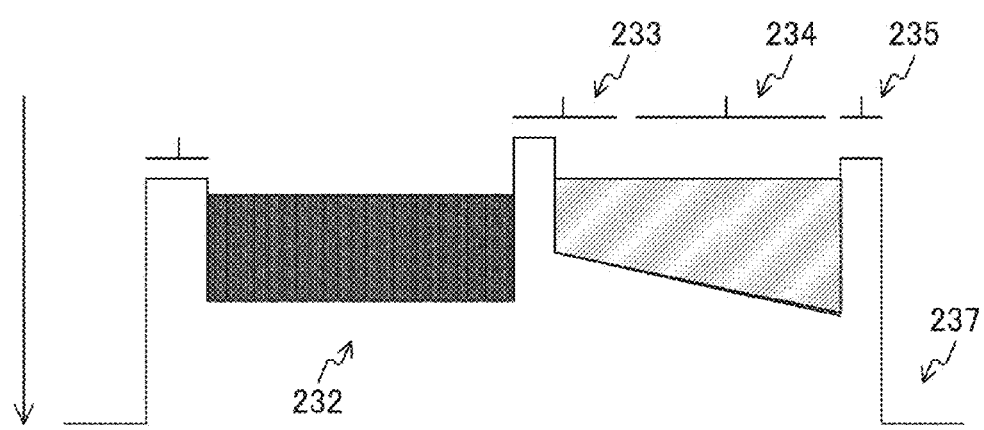

FIGS. 13A, 13B, and 13C illustrate exemplary potential diagrams of the pixel 230 at the time of discharging a charge and during third exposure in the embodiment of the present technology. FIG. 13A illustrates an exemplary potential diagram of the pixel 230 at the time of discharging a charge. FIG. 13B illustrates an exemplary potential diagram of the pixel 230 immediately after the third exposure. FIG. 13B illustrates an exemplary potential diagram of the pixel 230 during the third exposure.

As illustrated in FIG. 13A, immediately before the third exposure starts, the charge discharging transistor 231 sweeps a charge from the photoelectric conversion element 232. Therefore, the photoelectric conversion element 232 is initialized.

As illustrated in b simultaneously, when the third exposure starts, the photoelectric conversion element 232 generates a charge. An area of a black part in FIGS. 13A, 13B, and 13C indicates an amount of charge generated by the third exposure. Then, as illustrated in FIG. 13C, the amount of charge in the photoelectric conversion element 232 increases according to an exposure time.

Figure 14:
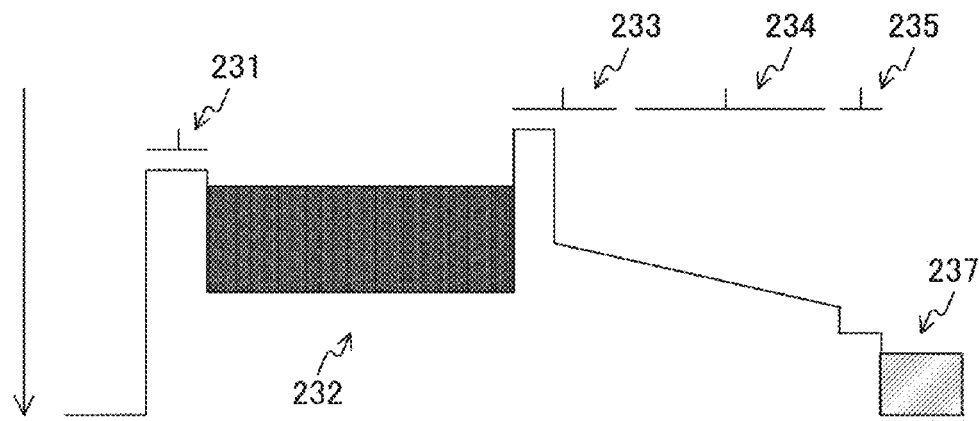
FIG. 14 illustrates an exemplary potential diagram of a pixel at the time of transferring a charge to a floating diffusion layer in the embodiment of the present technology.

FIG. 14 illustrates an exemplary potential diagram of the pixel 230 at the time of transferring a charge to the floating diffusion layer 237 in the embodiment of the present technology. As illustrated in FIG. 14, immediately before a third exposure end timing, the transfer transistor 235 transfers a charge from the charge holding transistor 234 to the floating diffusion layer 237. At this time, in the first row, the potential of the floating diffusion layer 237 corresponding to the amount of charge is read as the signal level. This signal level corresponds to the amount of second exposure. That is, output of a frame generated by the second exposure is started during the third exposure.

The control regarding the first exposure illustrated in FIGS. 7A, 7B, 7C, 8A, 8B, 8C, 9A, 9B, and 9C is executed in a period until the timing T3 of FIG. 6. The control regarding the second exposure illustrated in FIGS. 10A, 10B, 10C, 11A, 11B, 11C, 12A, and 12B is executed in a period from the timing T3 to the timing T7 of FIG. 6. The control regarding the third exposure illustrated in FIGS. 13A, 13B, 13C, and 14 is executed after the timing T7 of FIG. 6.

Comparing the first and third exposure control with the second exposure control, a charge is swept (i.e., discharged) from the photoelectric conversion element 232 immediately before the first and third exposure, but is not swept (i.e., discharged) immediately before the second exposure. This is because, as described above, the backward flow prevention transistor 233 prevents a backward flow to the photoelectric conversion element 232, and the photoelectric conversion element 232 is in an initialized state immediately after the first exposure end timing.

Note that the row scanning circuit 210 initializes the photoelectric conversion element 232 immediately before a third exposure start timing, but the present technology is not limited to this configuration. Immediately before the third or subsequent exposure starts, as well as immediately before the second exposure starts, the row scanning circuit 210 can omit the initialization of the photoelectric conversion element 232.

Figure 15:
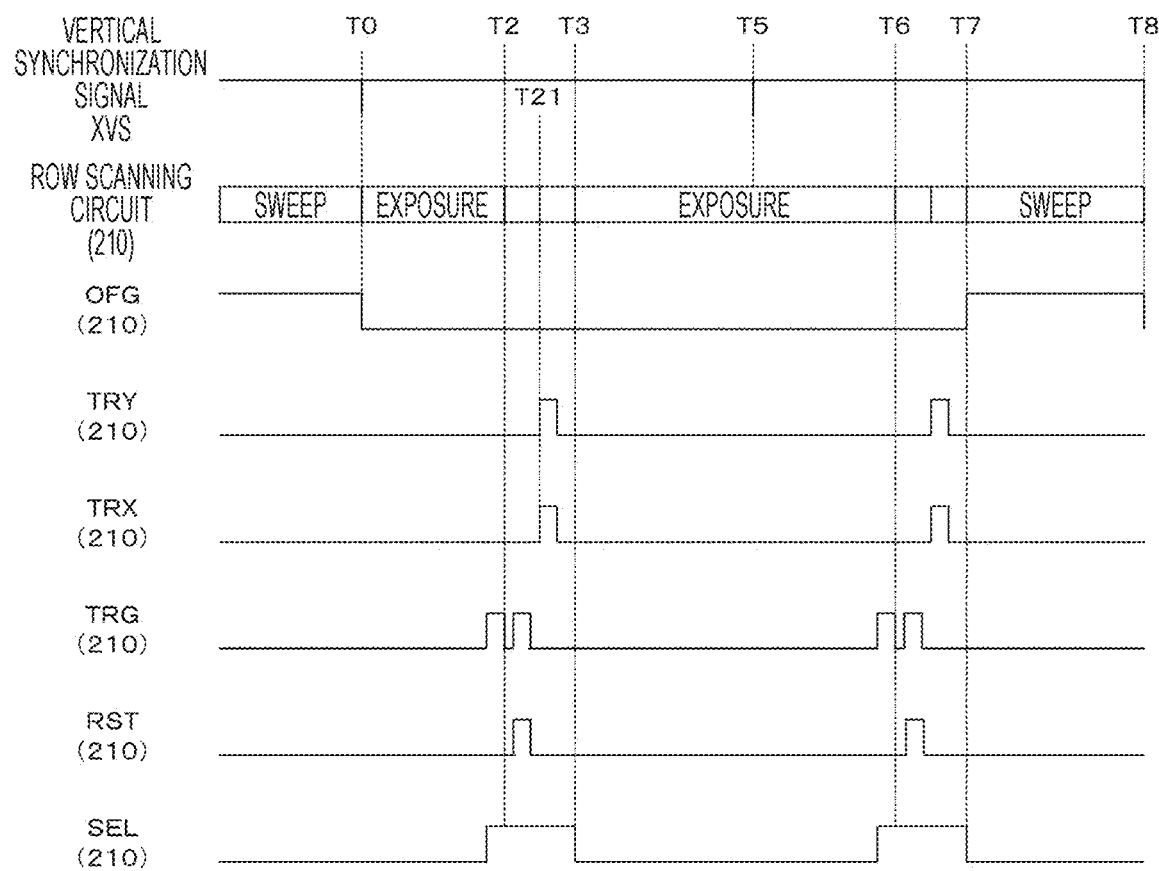
FIG. 15 is a timing chart showing an example of operation of a row scanning circuit in the embodiment of the present technology.

FIG. 15 is a timing chart showing an example of operation of the row scanning circuit 210 in the embodiment of the present technology.

Immediately before the timing T0 at which the first exposure starts, the row scanning circuit 210 supplies the reset signal OFG signal during a certain period. Therefore, charges are swept from the photoelectric conversion elements 232, thereby initializing the photoelectric conversion elements 232. Then, the first exposure is performed in the period from the timing T0 to the timing T2.

Then, immediately before the timing T2 at which the first exposure ends, the row scanning circuit 210 supplies the transfer signal TRG to the first row during the pulse period. Therefore, charges are transferred from the MOS capacitors to the floating diffusion layers 237. Further, immediately after the timing T2, the row scanning circuit 210 supplies the transfer signal TRG and the reset signal RST to the first row during the pulse period. Therefore, the floating diffusion layers 237 are initialized. The row scanning circuit 210 supplies a selection signal SEL to the first row during a reading period for the first row.

Then, at the timing T21, the row scanning circuit 210 supplies the transfer signals TRX and TRY during the pulse period. Therefore, the charges are transferred from the photoelectric conversion elements 232 to the MOS capacitors and are held therein. Then, the second exposure is performed from the timing T3 to the timing T6.

Then, immediately before the timing T6 at which the second exposure ends, the row scanning circuit 210 supplies the transfer signal TRG to the first row during the pulse period. Therefore, charges are transferred from the MOS capacitors to the floating diffusion layers 237. Therefore, signal levels corresponding to the amount of first exposure are read. Further, immediately after the timing T6, the row scanning circuit 210 supplies the transfer signal TRG and the reset signal RST to the first row during the pulse period. Therefore, the floating diffusion layers 237 are initialized.

Further, the row scanning circuit 210 supplies the reset signal OFG signal during a certain period in a period from the timing T7 to a timing T8 immediately before the third exposure starts.

As illustrated in FIGS. 6, 7A, 7B, 7C, 8A, 8B, 8C, 9A, 9B, 9C, 10A, 10B, 10C, 11A, 11B, 11C, 12A, 12B, 13A, 13B, 13C, 14, and 15, immediately before the first exposure start timing, the row scanning circuit 210 controls the charge discharging transistors 231 to discharge charges from the photoelectric conversion elements 232.

Meanwhile, immediately before the second or subsequent (e.g., only the second) exposure start timing, the row scanning circuit 210 controls the backward flow prevention transistors 233 to transfer charges from the photoelectric conversion elements 232 to the MOS capacitors of the charge holding transistors 234 without discharging charges. The backward flow prevention transistors 233 prevent a backward flow of the charges from the charge holding transistors 234 to the photoelectric conversion elements 232, and thus the photoelectric conversion elements 232 are in an initialized state immediately after the charges are transferred. Therefore, immediately before the second exposure start timing, the charge discharging transistors 231 do not sweep charges. Note that the row scanning circuit 210 is an example of a scanning circuit recited in the claims.

Figure 16:
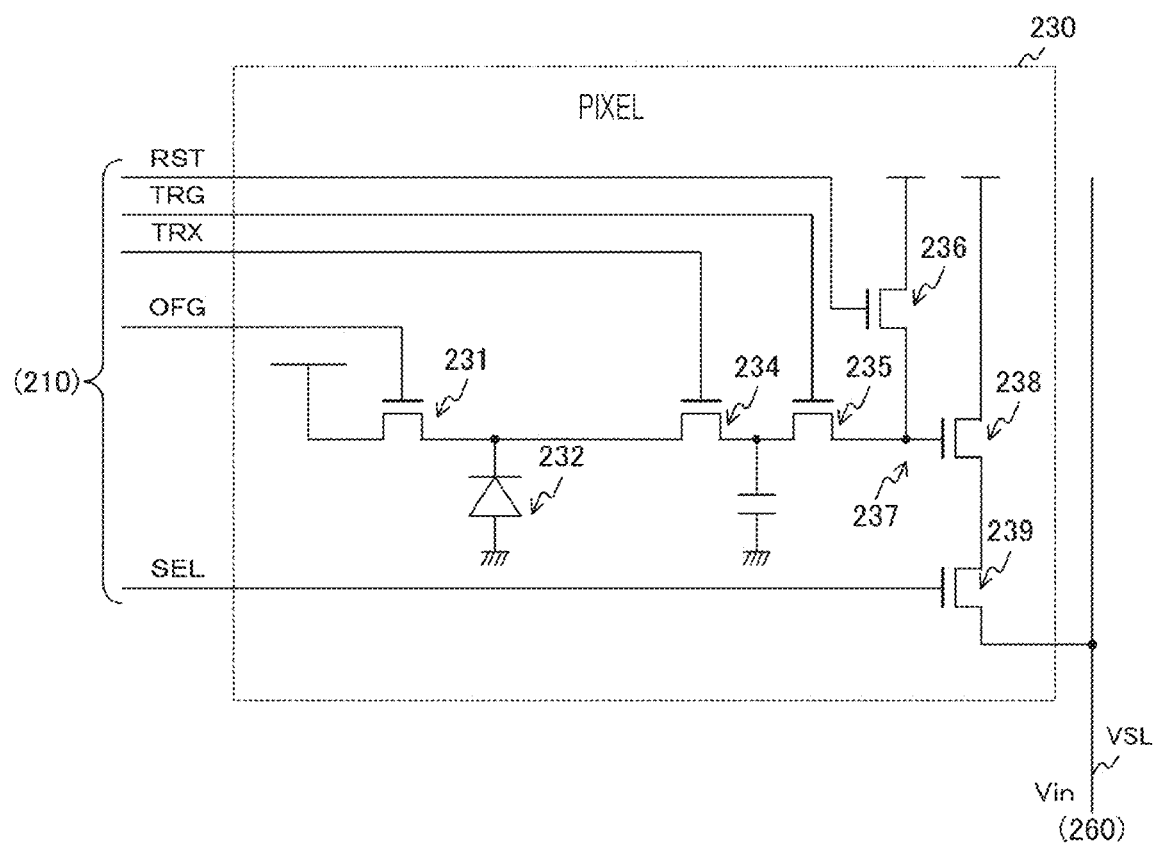
FIG. 16 is a circuit diagram showing a configuration example of a pixel in a comparative example.

Herein, as shown in FIG. 16, a comparative example where no backward flow prevention transistor 233 is provided in a pixel will be described.

Figure 17:
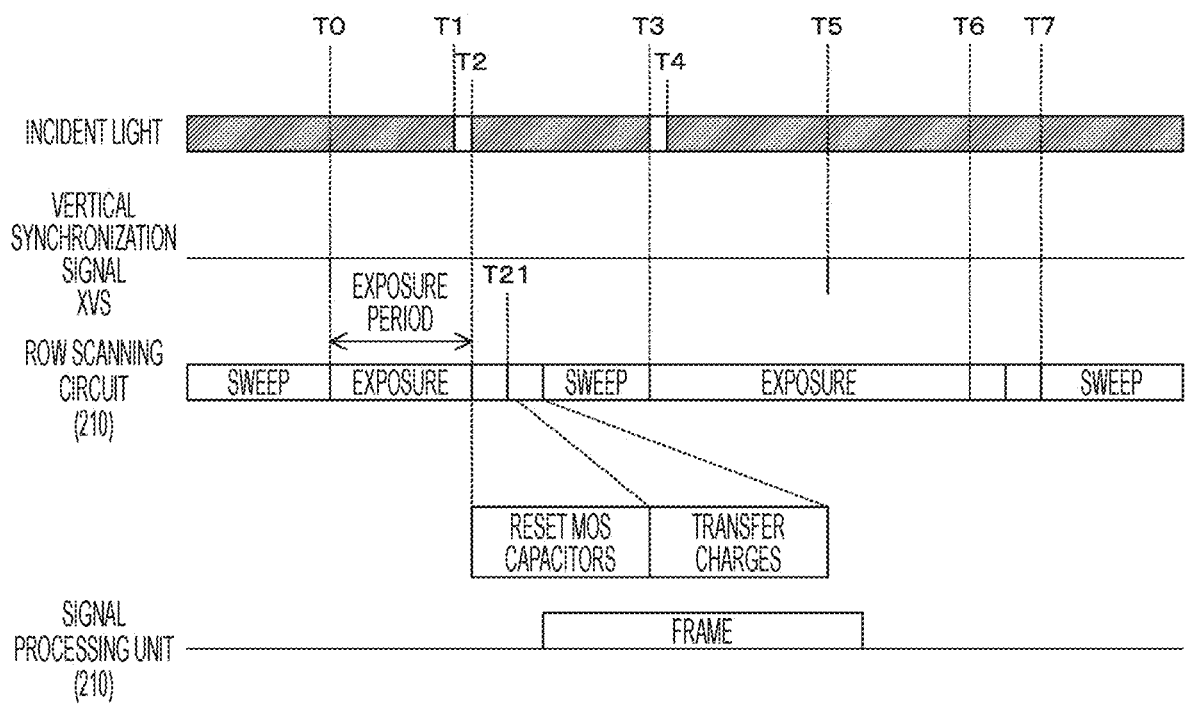
FIG. 17 is a timing chart showing an example of operation of a solid-state imaging element in the comparative example.

FIG. 17 is a timing chart showing an example of operation of a solid-state imaging element in the comparative example. In the comparative example, immediately before the timing T0 at which the first exposure starts, the row scanning circuit 210 controls the charge discharging transistors 231 to sweep charges as in a case where the backward flow prevention transistors 233 are provided. Further, in the comparative example, charges are also swept immediately before the timing T3 at which the second exposure starts.

Figure 18A:
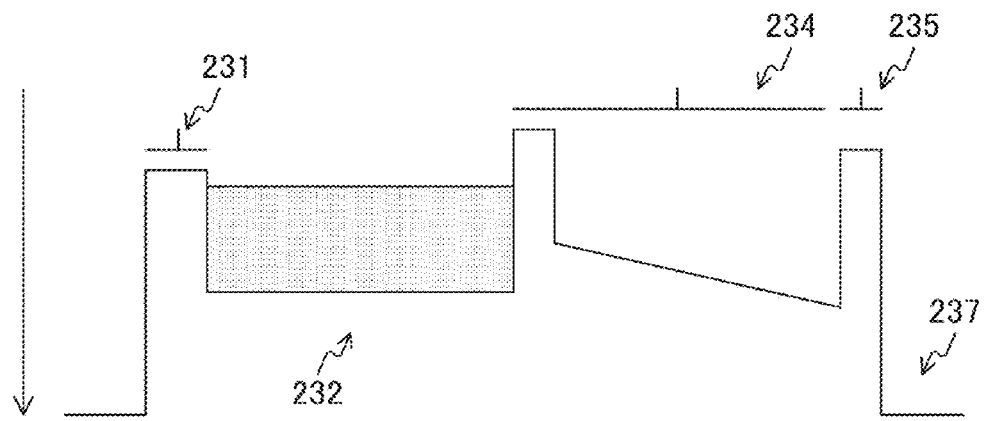
FIGS. 18A, 18B, and 18C illustrate exemplary potential diagrams of a pixel immediately after initialization and at the time of transferring a charge to a MOS capacitor in the comparative example.
Figure 18B:
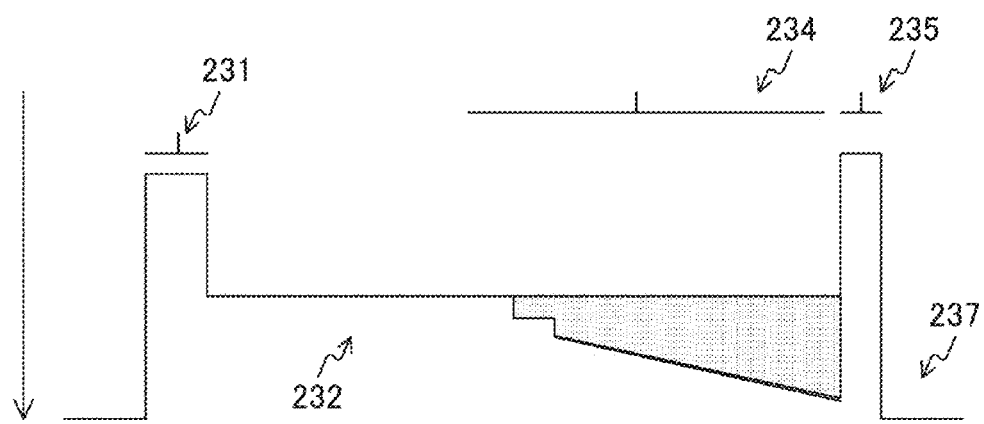
Figure 18C:
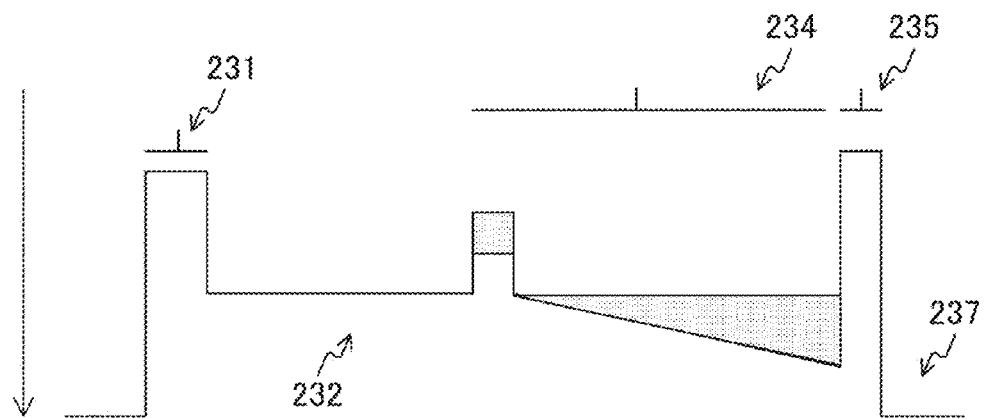

FIGS. 18A, 18B, and 18C illustrates exemplary potential diagrams of a pixel immediately after initialization and at the time of transferring a charge to a MOS capacitor in the comparative example. FIG. 18A illustrates an exemplary potential diagram of the pixel 230 immediately after initializing the floating diffusion layer 237. FIG. 18B illustrates an exemplary potential diagram of the pixel 230 at the time of transferring a charge to the MOS capacitor. FIG. 18C illustrates an exemplary potential diagram of the pixel 230 immediately before the transfer of the charge to the MOS capacitor is completed.

As illustrated in FIG. 18A, immediately after the floating diffusion layer 237 is initialized, the transfer transistor 235 and the reset transistor 236 (not illustrated) transition to an off state.

Then, as illustrated in FIG. 18B, when the exposure ends, the charge holding transistor 234 transitions to an on state during the pulse period under the control of the row scanning circuit 210. Therefore, a charge is transferred from the photoelectric conversion element 232 to the MOS capacitor of the charge holding transistor 234.

Then, as illustrated in FIG. 18C, the charge holding transistor 234 starts transitioning to an off state.

Figure 19A:
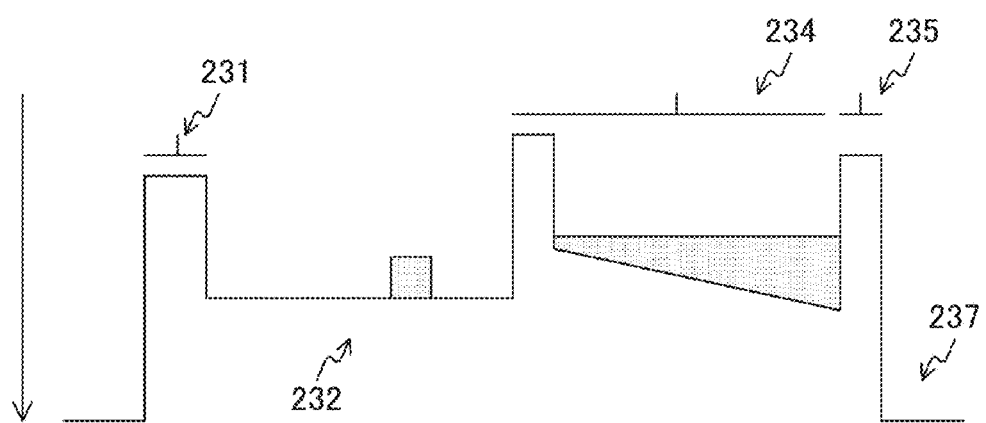
FIGS. 19A and 19B illustrate exemplary potential diagrams of a pixel immediately after a charge is transferred to a MOS capacitor and at the time of discharging a charge in the comparative example.
Figure 19B:
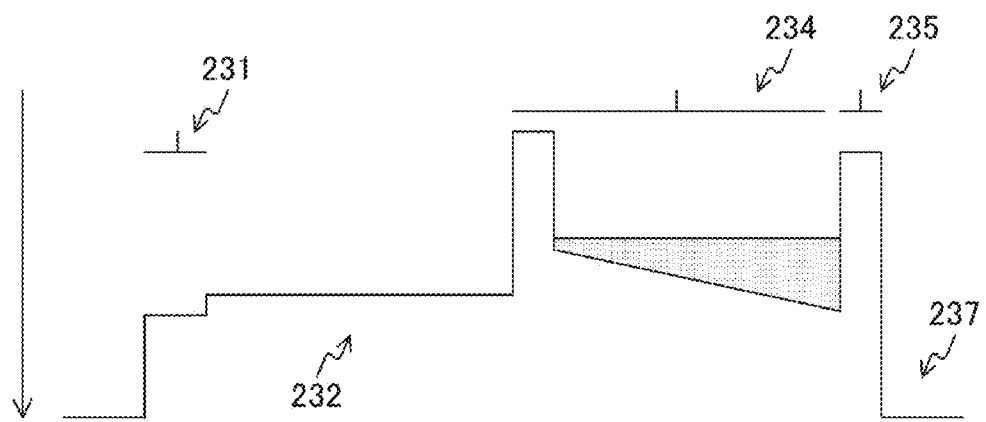

FIGS. 19A and 19B illustrate exemplary potential diagrams of the pixel immediately after transferring a charge to the MOS capacitor and at the time of discharging a charge in the comparative example. FIG. 19A illustrates an exemplary potential diagram of the pixel 230 immediately after transferring a charge to the MOS capacitor. FIG. 19B illustrates an exemplary potential diagram of the pixel 230 at the time of discharging a charge.

As illustrated in FIG. 19A, in the comparative example where no backward flow prevention transistor 233 is provided, when the charge holding transistor 234 transitions to an off state, a charge may flow backward from the MOS capacitor to the photoelectric conversion element 232. This backward flow of the charge may reduce image quality of image data.

Therefore, as illustrated in FIG. 19B, in the comparative example, the charge discharging transistor 231 needs to transition to an on state and sweep the charge from the photoelectric conversion element 232 immediately before the second or subsequent exposure starts.

As illustrated in FIGS. 17, 18A, 18B, 18C, 19A, and 19B, in the comparative example where no backward flow prevention transistor 233 is provided, a charge may flow backward from the MOS capacitor to the photoelectric conversion element 232 immediately after the first exposure ends. Therefore, immediately before the second exposure starts, the charge discharging transistor 231 needs to sweep the charge from the photoelectric conversion element 232 to initialize the photoelectric conversion element 232. By this initialization, potentials of a power supply and a ground fluctuate. Time until the potentials are stabilized generally increases as the number of pixels increases. Therefore, in the comparative example, an imaging interval becomes longer (in other words, a frame rate decreases) as the number of pixels increases. Accordingly, it is impossible to achieve both an increase in the number of pixels and improvement in the frame rate.

Meanwhile, in the solid-state imaging element 200 in which the backward flow prevention transistor 233 is provided, a backward flow is prevented by the backward flow prevention transistor 233. Thus, it is unnecessary to initialize the photoelectric conversion element 232 immediately before the second exposure starts. This makes it possible to improve the frame rate even in a case where the number of pixels increases. Therefore, it is possible to shorten a light emission interval of the lighting device and improve performance of the imaging apparatus 100 that detects the presence or absence of particles.

Figure 20A:
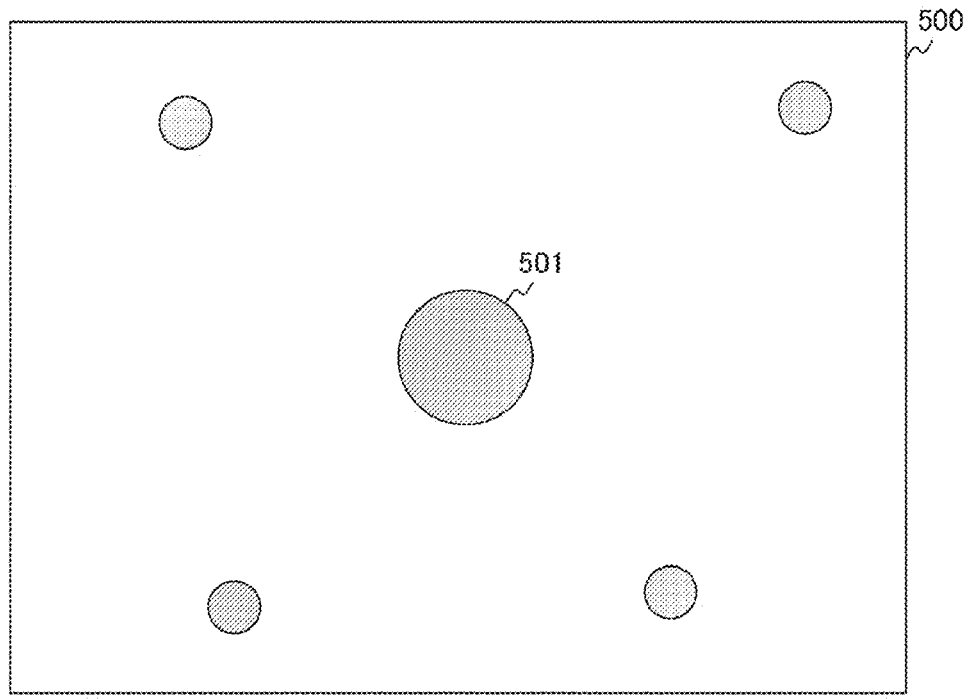
FIGS. 20A and 20B illustrate illustrates an example of a frame in the embodiment of the present technology.
Figure 20B:
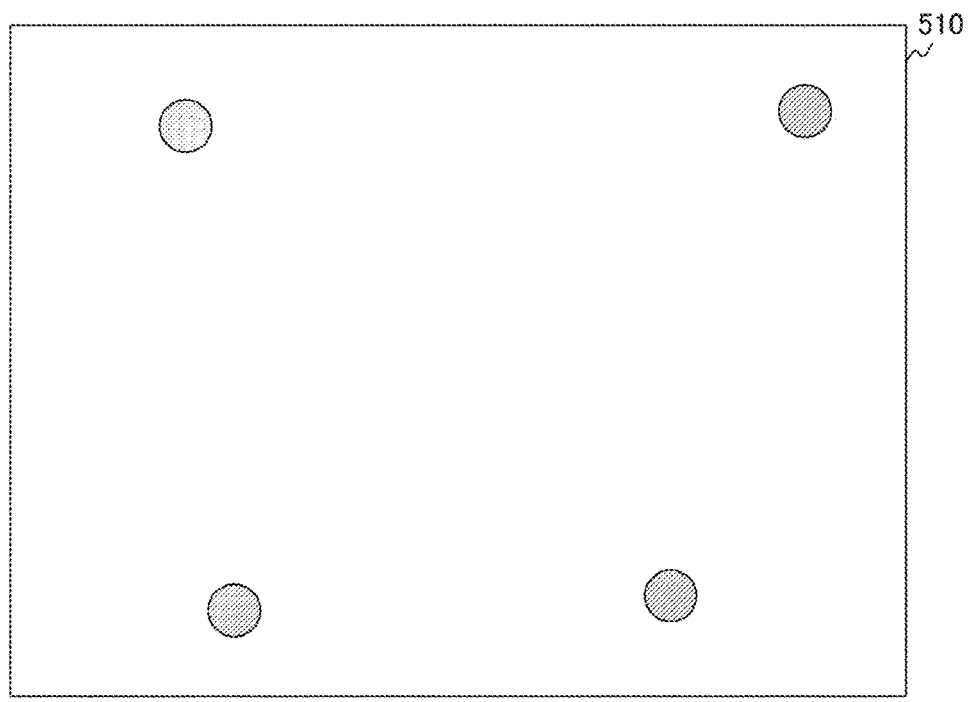

FIGS. 20A and 20B illustrates an example of a frame in the embodiment of the present technology. FIG. 20A illustrates an example of a first frame 500. FIG. 20B illustrates an example of a second frame 510.

A particle 501 appears in the first frame 500 as illustrated in FIG. 20A, but the particle 501 does not appear in the second frame 510 as illustrated in FIG. 20B. Therefore, the imaging apparatus 100 can detect the presence or absence of the particle 501 by obtaining a difference between those frames.

Figure 21:
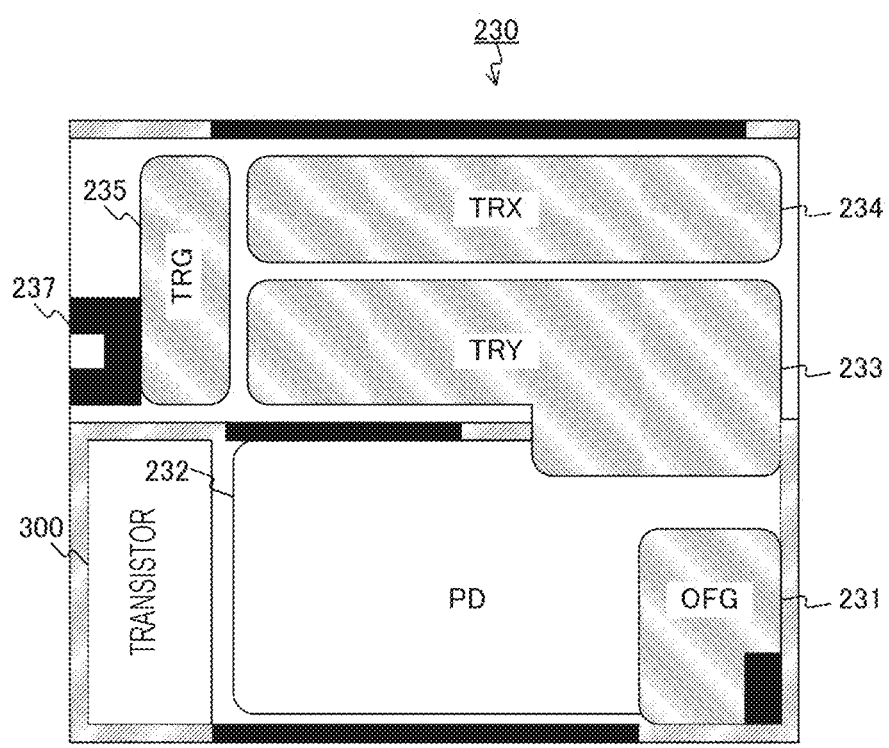
FIG. 21 is a plan view illustrating an example of a layout of elements in a pixel in the embodiment of the present technology.

FIG. 21 is a plan view illustrating an example of a layout of elements in the pixel 230 in the embodiment of the present technology. As illustrated in FIG. 21, the charge discharging transistor 231 is arranged to be adjacent to the photoelectric conversion element 232. Further, the backward flow prevention transistor 233 is formed to protrude toward the photoelectric conversion element 232. The charge holding transistor 234 and the transfer transistor 235 are arranged to be adjacent to the backward flow prevention transistor 233. Further, the floating diffusion layer 237 is arranged to be adjacent to the transfer transistor 235. The reset transistor 236, the amplifier transistor 238, and the selection transistor 239 are arranged in, for example, the transistor 300 of FIG. 21.

Figure 22:
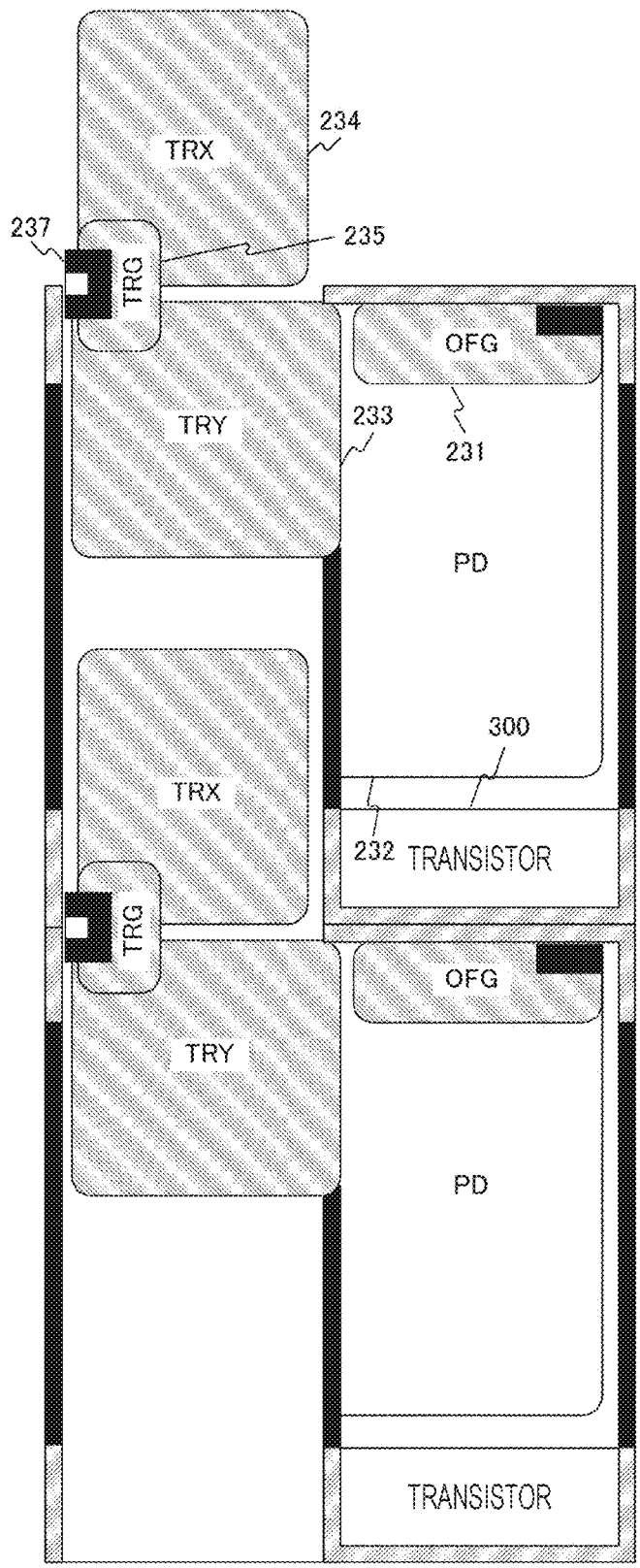
FIG. 22 is a plan view illustrating an example of a layout of elements in two adjacent pixels in the embodiment of the present technology.

FIG. 22 is a plan view illustrating an example of a layout of elements in two adjacent pixels in the embodiment of the present technology. The layout of FIG. 23 is different from that of FIG. 21 in that the transfer transistor 235 and the floating diffusion layer 237 are arranged between the backward flow prevention transistor 233 and the charge holding transistor 234.

Figure 23:
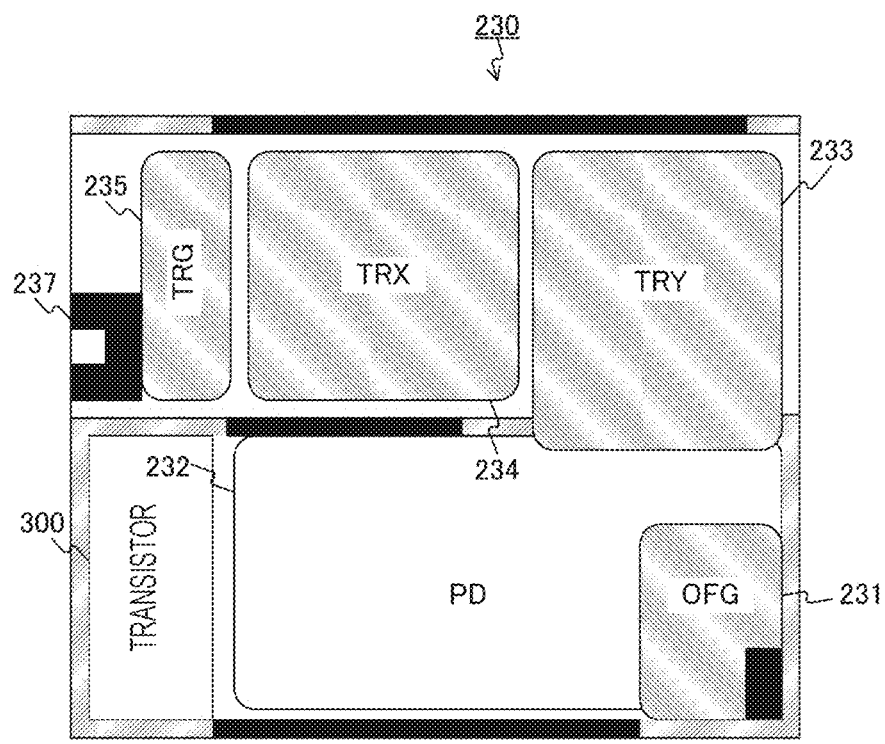
FIG. 23 is a plan view illustrating another example of a layout of elements in a pixel in the embodiment of the present technology.

FIG. 23 is a plan view illustrating another example of the layout of the elements in the pixel 230 in the embodiment of the present technology. The layout of FIG. 23 is different from that of FIG. 21 in that the charge holding transistor 234 is arranged between the backward flow prevention transistor 233 and the transfer transistor 235.

Figure 24:
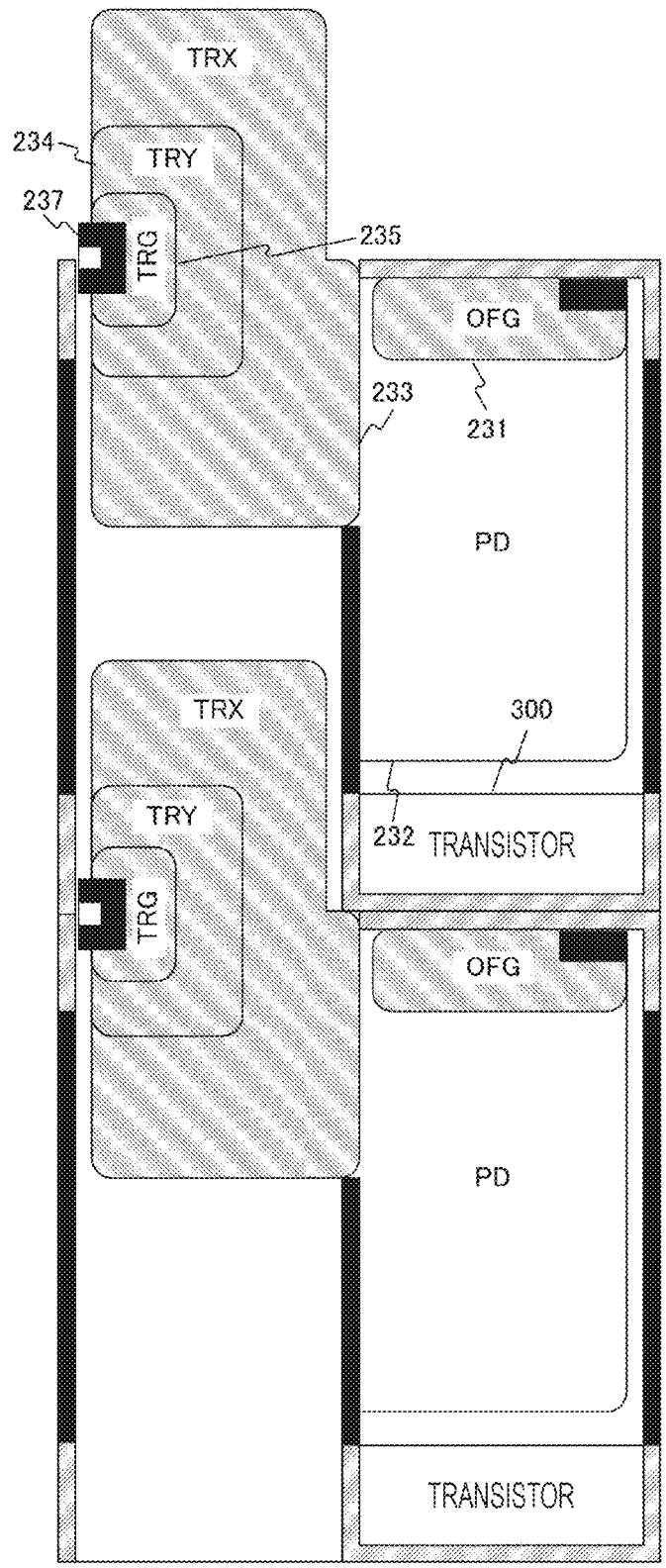
FIG. 24 is a plan view illustrating another example of a layout of elements in two adjacent pixels in the embodiment of the present technology.

FIG. 24 is a plan view illustrating another example of the layout of the elements in the two adjacent pixels in the embodiment of the present technology. The layout of FIG. 24 is different from that of FIG. 21 in that the charge holding transistor 234 is formed around the transfer transistor 235 and the backward flow prevention transistor 233 is formed around the charge holding transistor 234.

Figure 25:
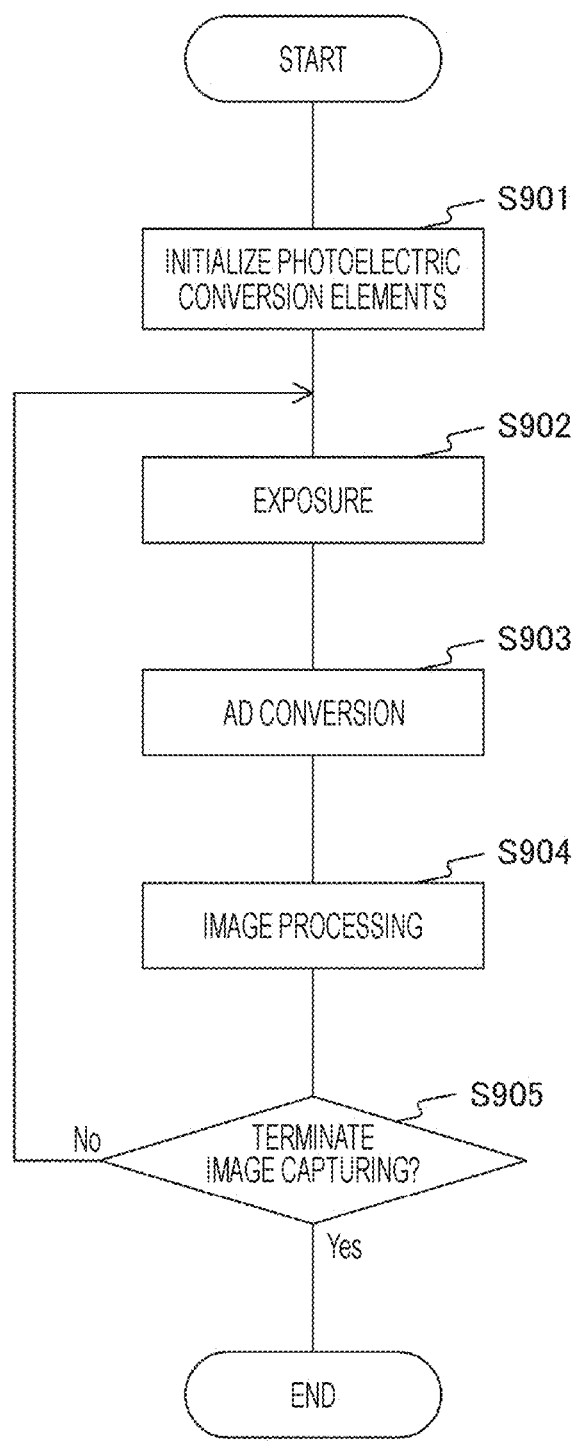
FIG. 25 is a flowchart showing an example of operation of an imaging apparatus in the embodiment of the present technology.

FIG. 25 is a flowchart showing an example of operation of the imaging apparatus 100 in the embodiment of the present technology. This operation is started when, for example, a predetermined application for capturing an image is executed.

The row scanning circuit 210 in the solid-state imaging element 200 initializes the photoelectric conversion elements 232 of all the pixels by using the reset signal OFG. Then, the row scanning circuit 210 exposes all the pixels for a certain exposure time (step S902). Further, in parallel with the exposure, the column signal processing unit 260 sequentially AD converts pixel signals in one row at a time (step S903). Further, the signal processing unit 130 performs various kinds of image processing, such as processing of obtaining a difference between frames, on a captured frame (step S904). Then, the imaging apparatus 100 determines whether or not it is a timing to terminate the image capturing (step S905).

In a case where it is not the timing to terminate the image capturing (step S905: No), the imaging apparatus 100 repeats step S902 and subsequent steps without initializing the photoelectric conversion elements 232. Meanwhile, in a case where it is the timing to terminate the image capturing (step S905: Yes), the imaging apparatus 100 terminates the image capturing operation.

As described above, according to the embodiment of the present technology, the backward flow prevention transistor 233 transitions to an off state immediately after a charge is transferred, and a potential barrier is generated between the photoelectric conversion element 232 and the charge holding transistor 234. This makes it possible to prevent a backward flow of the charge to the photoelectric conversion element 232. With this prevention of the backward flow, the row scanning circuit 210 does not need to initialize the photoelectric conversion element 232 immediately before the second exposure starts. This makes it possible to improve the frame rate even in a case where the number of pixels increases.

Modification Example

In the embodiment described above, the synchronization control unit 120 disables the light emission enable signal within the exposure prohibition period to restrict the light emission operation of the lighting device. However, in this configuration, in a case where the lighting device emits light immediately before or immediately after the exposure prohibition period, remaining light thereof may leak into the solid-state imaging element 200 within the exposure prohibition period. The imaging apparatus 100 in a modification example of the embodiment is different from that in the embodiment in that a mechanical shutter is controlled to be closed within the exposure prohibition period.

Figure 26:
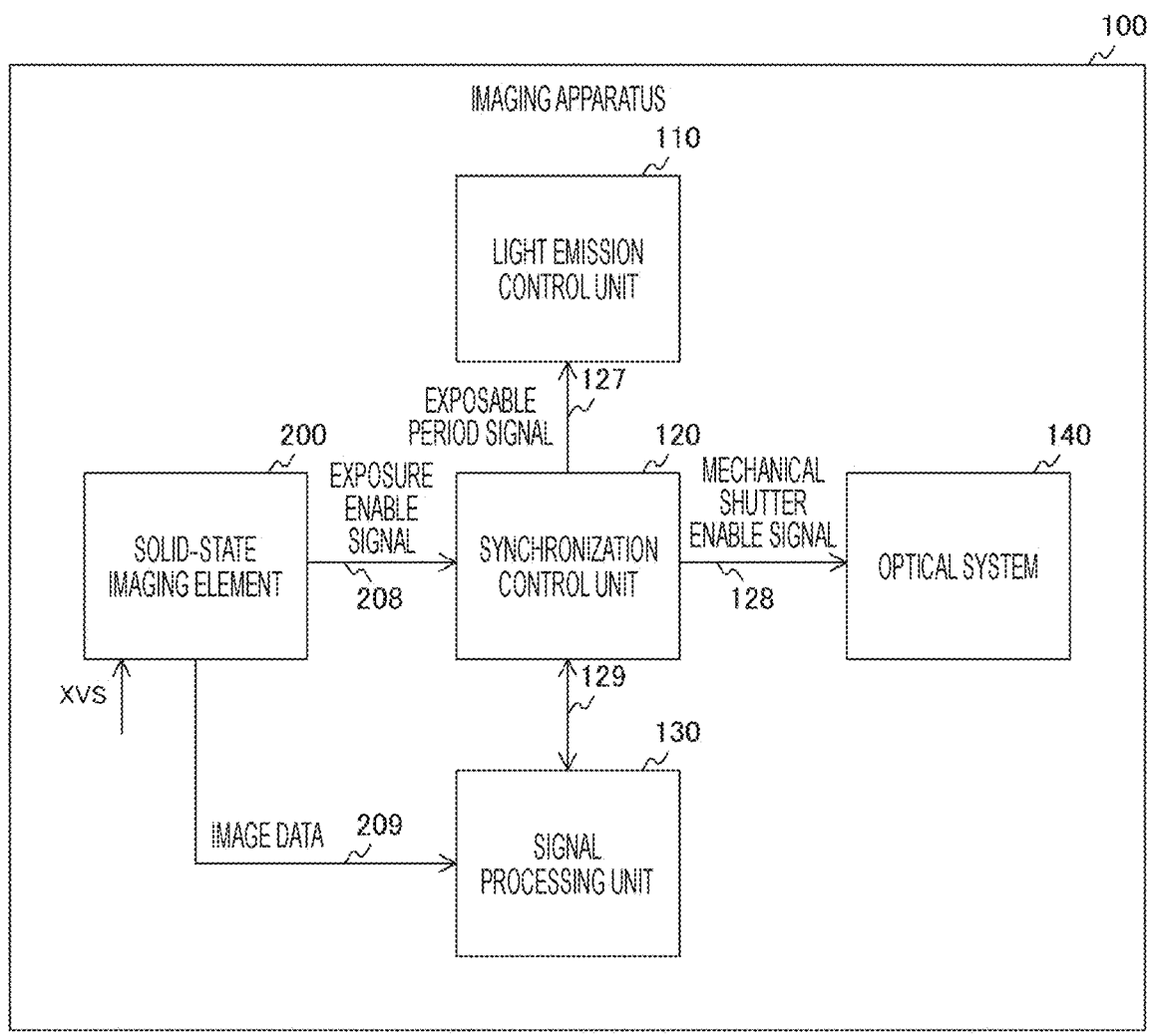
FIG. 26 is a block diagram showing a configuration example of an imaging apparatus in a modification example of the embodiment of the present technology.

FIG. 26 is a block diagram showing a configuration example of the imaging apparatus 100 in the modification example of the embodiment of the present technology. The imaging apparatus 100 in the modification example of the embodiment is different from that in the embodiment in that the synchronization control unit 120 further transmits a mechanical shutter enable signal to the optical system 140.

Herein, the mechanical shutter enable signal is a signal indicating an open/closed state of the mechanical shutter of the optical system 140. The synchronization control unit 120 in the modification example of the embodiment enables the mechanical shutter enable signal within the exposable period. Further, the synchronization control unit 120 disables the mechanical shutter enable signal within a charge transfer period in the exposure prohibition period.

Further, the optical system 140 in the modification example of the embodiment includes not only the diaphragm and the lens but also the mechanical shutter. Furthermore, the optical system 140 opens and closes the mechanical shutter in response to the mechanical shutter enable signal. Specifically, the optical system 140 opens the mechanical shutter in a case where the mechanical shutter enable signal is enabled and closes the mechanical shutter in a case where the mechanical shutter enable signal is disabled.

Figure 27:
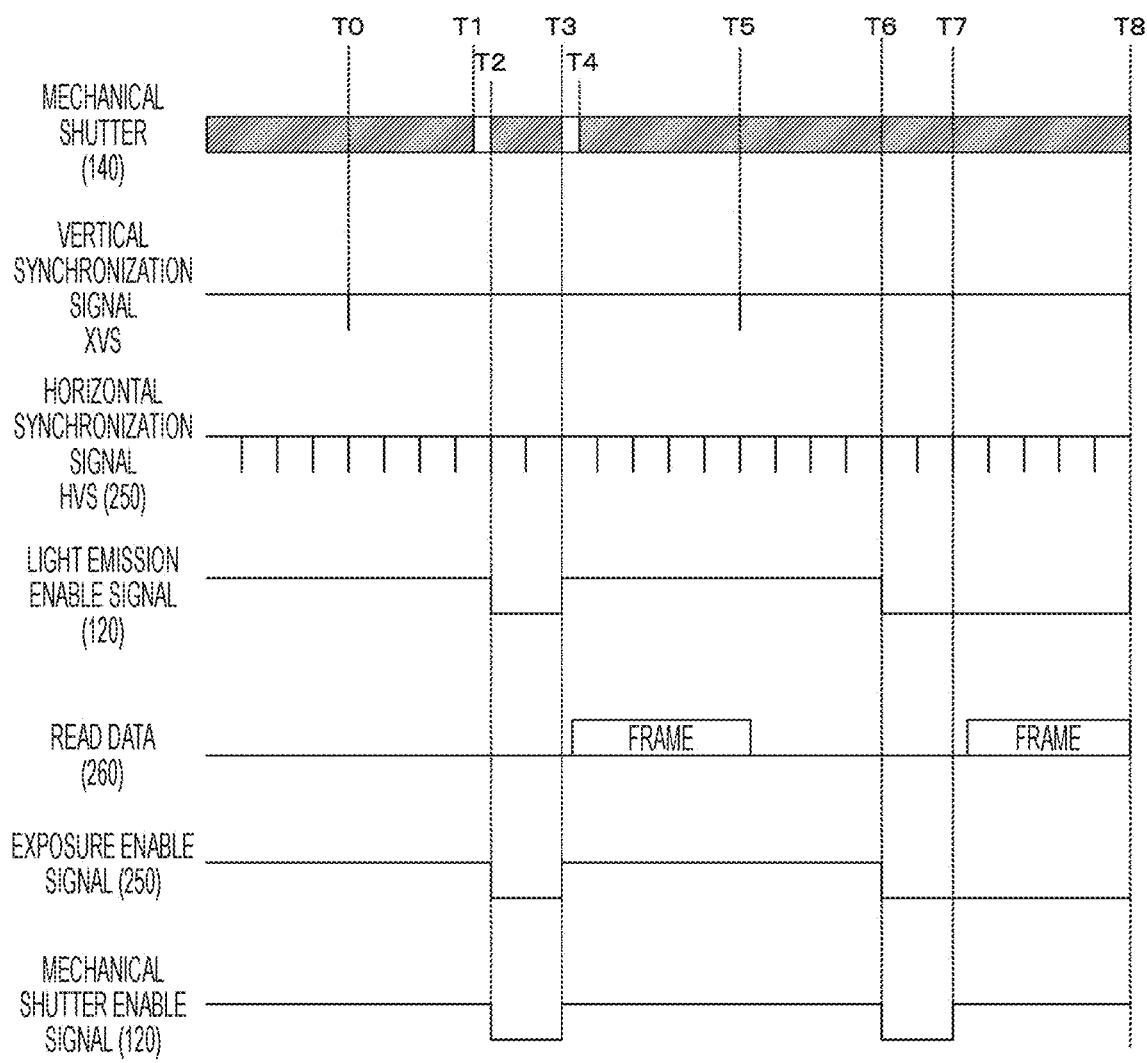
FIG. 27 is a timing chart showing an example of operation of an imaging apparatus in the embodiment of the present technology.

FIG. 27 is a timing chart showing an example of operation of the imaging apparatus 100 in the embodiment of the present technology. As shown in FIG. 27, the synchronization control unit 120 enables the mechanical shutter enable signal within the exposable periods such as a period until the timing T2 and the period from the timing T3 to the timing T6. Further, the synchronization control unit 120 also enables the light emission enable signal within those exposable periods. Further, the synchronization control unit 120 enables the mechanical shutter enable signal within a charge sweeping period in the exposure prohibition period, such as a period after the timing T7.

Meanwhile, the synchronization control unit 120 disables the mechanical shutter enable signal within the charge transfer period in the exposure prohibition period. For example, the synchronization control unit 120 disables the mechanical shutter enable signal within the exposure prohibition period from the timing T2 to the timing T3 and the transfer period from the timing T6 to the timing T7. This makes it possible to prevent light from leaking into the solid-state imaging element 200 within the transfer period. Further, the synchronization control unit 120 disables the light emission enable signal within the exposure prohibition period such as the period from the timing T2 to the timing T3.

As described above, according to the modification example of the embodiment of the present technology, the synchronization control unit 120 disables the mechanical shutter enable signal within the charge transfer period. This makes it possible to prevent light from leaking into the solid-state imaging element 200 within the period.

<Examples of Application to Moving Objects>

The technology according to the present disclosure (present technology) is applicable to various products. For example, the technology according to the present disclosure may be achieved as an apparatus to be mounted on any type of moving objects such as an automobile, an electric vehicle, a hybrid electric vehicle, a motorcycle, a bicycle, personal mobility, an airplane, a drone, a ship, and a robot.

Figure 28:
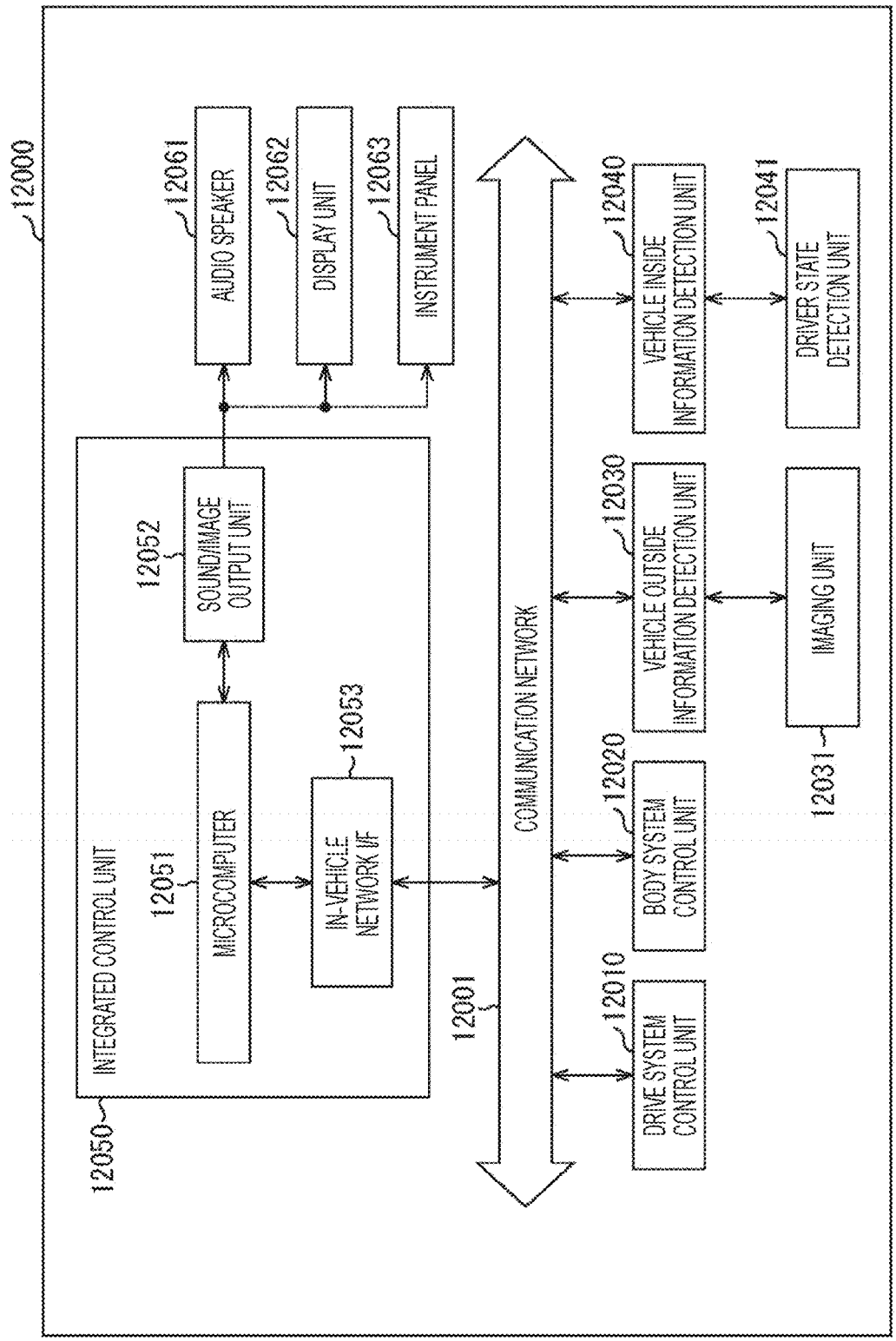
FIG. 28 is a block diagram showing an example of a schematic configuration of a vehicle control system.

FIG. 28 is a block diagram showing a schematic configuration example of a vehicle control system that is an example of a moving object control system to which the technology according to the present disclosure is applicable.

A vehicle control system 12000 includes a plurality of electronic control units connected via a communication network 12001. In the example of FIG. 28, the vehicle control system 12000 includes a drive system control unit 12010, a body system control unit 12020, a vehicle outside information detection unit 12030, a vehicle inside information detection unit 12040, and an integrated control unit 12050. Further, the integrated control unit 12050 includes, as a functional configuration, a microcomputer 12051, a sound/image output unit 12052, and an in-vehicle network interface (I/F) 12053.

The drive system control unit 12010 controls operation of devices related to a drive system of a vehicle in accordance with various programs. For example, the drive system control unit 12010 functions as a control device for a driving force generator for generating driving force of the vehicle, such as an internal combustion engine or a driving motor, a driving force transmission mechanism for transmitting driving force to wheels, a steering mechanism for adjusting a steering angle of the vehicle, a braking device for generating braking force of the vehicle, and the like.

The body system control unit 12020 controls operation of various devices mounted on a vehicle body in accordance with various programs. For example, the body system control unit 12020 functions as a control device for a keyless entry system, a smart key system, a power window device, or various lamps such as a headlamp, a back lamp, a brake lamp, a blinker, and a fog lamp. In this case, radio waves transmitted from a portable device that substitutes for a key or signals of various switches can be input to the body system control unit 12020. The body system control unit 12020 accepts input of those radio waves or signals and controls the door lock device, the power window device, the lamps, and the like of the vehicle.

The vehicle outside information detection unit 12030 detects information regarding outside of the vehicle on which the vehicle control system 12000 is mounted. For example, the vehicle outside information detection unit 12030 is connected to an imaging unit 12031. The vehicle outside information detection unit 12030 causes the imaging unit 12031 to capture an image of the outside of the vehicle and receives the captured image. Based on the received image, the vehicle outside information detection unit 12030 may perform processing of detecting an object such as a person, a vehicle, an obstacle, a sign, or a character on a road surface or processing of detecting a distance.

The imaging unit 12031 is an optical sensor that receives light and outputs an electrical signal corresponding to an amount of the received light. The imaging unit 12031 can output the electrical signal as an image or as distance measurement information. Further, the light received by the imaging unit 12031 may be visible light or invisible light such as infrared rays.

The vehicle inside information detection unit 12040 detects information regarding inside of the vehicle. For example, the vehicle inside information detection unit 12040 is connected to a driver state detection unit 12041 that detects a state of a driver. The driver state detection unit 12041 includes, for example, a camera that captures an image of the driver, and, based on detection information input from the driver state detection unit 12041, the vehicle inside information detection unit 12040 may calculate a degree of fatigue or concentration of the driver or determine whether or not the driver falls asleep.

The microcomputer 12051 can calculate a control target value of the driving force generator, the steering mechanism, or the braking device on the basis of the information regarding the inside and outside of the vehicle acquired by the vehicle outside information detection unit 12030 or the vehicle inside information detection unit 12040, and output a control command to the drive system control unit 12010. For example, the microcomputer 12051 can perform cooperative control for the purpose of realizing functions of an advanced driver assistance system (ADAS) including collision avoidance or impact attenuation of vehicles, following traveling based on a following distance, vehicle speed maintenance traveling, vehicle collision warning, vehicle lane departure warning, or the like.

Further, the microcomputer 12051 can perform cooperative control, for example, for the purpose of autonomous driving in which the vehicle autonomously travels without depending on the driver's operation or other purposes by controlling the driving force generator, the steering mechanism, the braking device, or the like on the basis of information regarding surroundings of the vehicle acquired by the vehicle outside information detection unit 12030 or the vehicle inside information detection unit 12040.

Further, the microcomputer 12051 can output a control command to the body system control unit 12020 on the basis of the information regarding the outside of the vehicle acquired by the vehicle outside information detection unit 12030. For example, the microcomputer 12051 can perform cooperative control for the purpose of glare protection by, for example, controlling the headlamp in accordance with a position of a preceding vehicle or oncoming vehicle detected by the vehicle outside information detection unit 12030 to switch a high beam to a low beam.

The sound/image output unit 12052 transmits an output signal of at least one of sound or image to an output device capable of visually or aurally notifying a vehicle passenger or the outside of the vehicle of information. The example of FIG. 28 shows an audio speaker 12061, a display unit 12062, and an instrument panel 12063 as examples of the output device. The display unit 12062 may include, for example, at least one of an on-board display or a head-up display.

Figure 29:
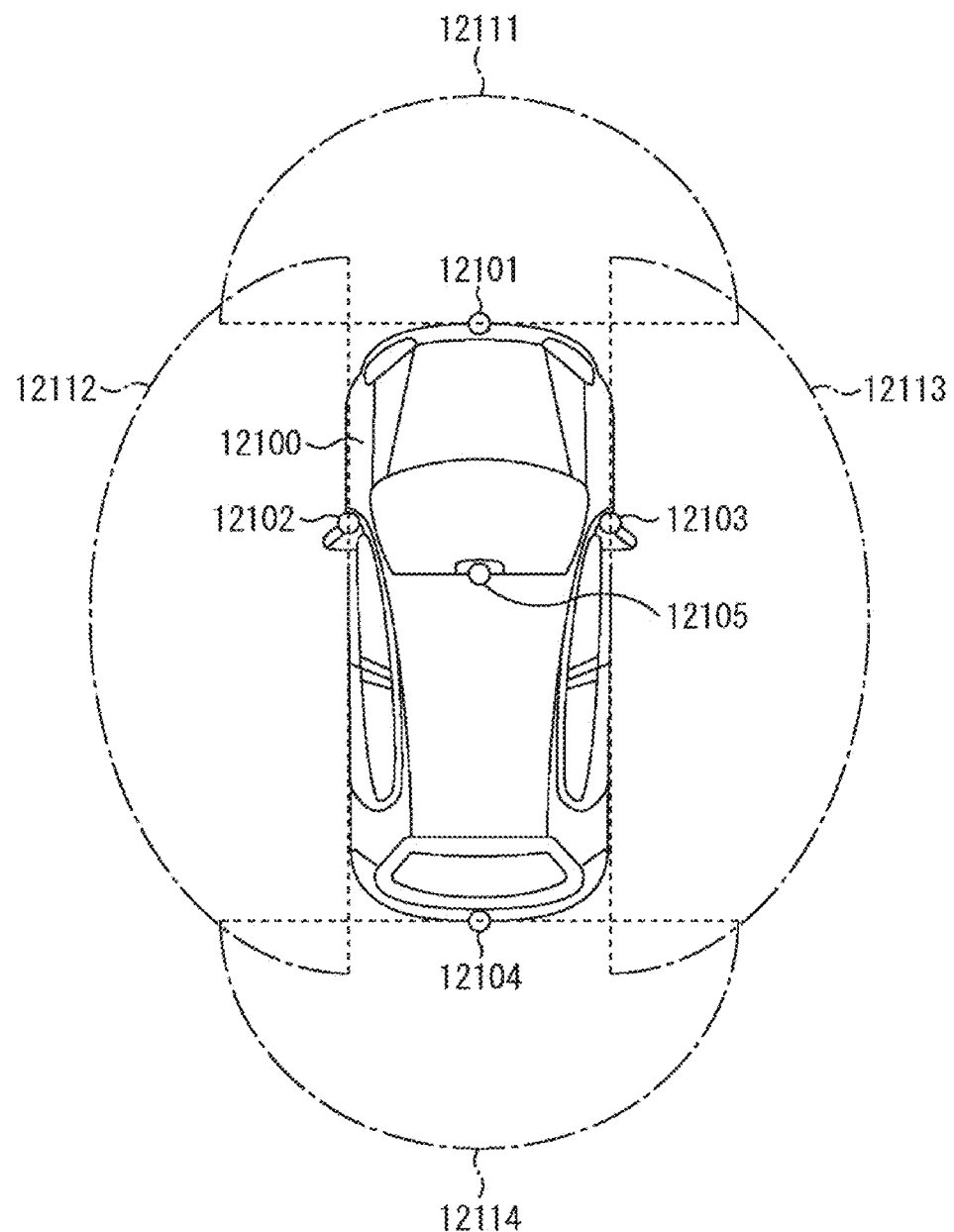
FIG. 29 is an explanatory diagram showing an example of installation positions of a vehicle outside information detection unit and an imaging unit.

FIG. 29 shows an example of an installation position of the imaging unit 12031.

In FIG. 29, the imaging unit 12031 includes imaging units 12101, 12102, 12103, 12104, and 12105.

The imaging units 12101, 12102, 12103, 12104, and 12105 are provided at, for example, positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images of a front view of the vehicle 12100. The imaging units 12102 and 12103 provided at the side mirrors mainly acquire images of side views of the vehicle 12100. The imaging unit 12104 provided at the rear bumper or back door mainly acquires an image of a rear view of the vehicle 12100. The imaging unit 12105 provided at the upper portion of the windshield in the vehicle interior is mainly used for detecting a preceding vehicle, a pedestrian, an obstacle, a traffic light, a traffic sign, a lane, or the like.

Note that FIG. 29 shows examples of imaging ranges of the imaging units 12101 to 12104. An imaging range 12111 indicates the imaging range of the imaging unit 12101 provided at the front nose. Imaging ranges 12112 and 12113 indicate the respective imaging ranges of the imaging units 12102 and 12103 provided at the side mirrors. An imaging range 12114 indicates the imaging range of the imaging unit 12104 provided at the rear bumper or back door. For example, an overhead image of the vehicle 12100 viewed from above is obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, the microcomputer 12051 obtains a distance from each three-dimensional object within the imaging ranges 12111 to 12114 and a temporal change in this distance (relative speed to the vehicle 12100) on the basis of distance information obtained from the imaging units 12101 to 12104 and can therefore particularly extract, as a preceding vehicle, the closest three-dimensional object existing on a traveling path of the vehicle 12100 and travelling at a predetermined speed (e.g., 0 km/h or more) in substantially the same direction as the vehicle 12100. Further, the microcomputer 12051 can set a following distance from the preceding vehicle to be secured in advance and perform automatic brake control (including following stop control), automatic acceleration control (including following start control), and the like. Thus, it is possible to perform cooperative control, for example, for the purpose of autonomous driving in which the vehicle autonomously travels without depending on the driver's operation or other purposes.

For example, the microcomputer 12051 can classify three-dimensional object data regarding three-dimensional objects into two-wheeled vehicles, standard vehicles, large vehicles, pedestrians, power poles, other three-dimensional objects, and the like on the basis of the distance information obtained from the imaging units 12101 to 12104, extract the three-dimensional object data, and therefore use the three-dimensional object data to automatically avoid obstacles. For example, the microcomputer 12051 identifies obstacles around the vehicle 12100 as obstacles that are noticeable for the driver of the vehicle 12100 and obstacles that are hardly noticeable therefor. Further, the microcomputer 12051 determines a collision risk indicating a risk of collision with each obstacle, and, when the collision risk is equal to or larger than a set value, i.e., in a state in which collision may occur, the microcomputer 12051 can perform driving assistance for collision avoidance by outputting an alarm to the driver via the audio speaker 12061 or the display unit 12062 or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such recognition of the pedestrian is carried out by performing, for example, a procedure for extracting feature points in the captured images of the imaging units 12101 to 12104 serving as infrared cameras and a procedure for performing pattern matching processing on a series of the feature points indicating an outline of an object and determining whether or not the object is a pedestrian. When the microcomputer 12051 determines that a pedestrian exists in the captured images of the imaging units 12101 to 12104 and recognizes the pedestrian, the sound/image output unit 12052 controls the display unit 12062 so that a rectangular outline for emphasis is displayed to be superimposed on the recognized pedestrian. Further, the sound/image output unit 12052 may control the display unit 12062 so that an icon or the like indicating the pedestrian is displayed at a desired position.

Hereinabove, an example of the vehicle control system to which the technology according to the present disclosure is applicable has been described. The technology according to the present disclosure is applicable to, for example, the imaging unit 12031 among the above-described configurations. Specifically, the imaging apparatus 100 in FIG. 1 is applicable to the imaging unit 12031. By applying the technology according to the present disclosure to the imaging unit 12031, it is possible to improve the frame rate while increasing the number of pixels. This can improve quality of a moving image.

Note that the above embodiments show examples for embodying the present technology, and the matters in the embodiments and the matters specifying the invention in the claims have a corresponding relationship. Similarly, the matters specifying the invention in the claims and the matters in the embodiments of the present technology represented by the same names as those in the matters specifying the invention in the claims have a corresponding relationship. However, the present technology is not limited to the embodiment, and can be embodied by applying various modifications to the embodiment within the gist thereof.

Note that the effects described in this specification are merely examples and are not limited, and other effects may be exerted.

Note that the present technology may also have the following configurations.

(1) A solid-state imaging element including:
a photoelectric conversion element that generates a charge by photoelectric conversion;
a charge holding transistor that holds the charge;
a backward flow prevention transistor that generates a potential barrier between the photoelectric conversion element and the charge holding transistor immediately after the charge is transferred from the photoelectric conversion element to the charge holding transistor;
a floating diffusion layer that accumulates the charge and generates a voltage corresponding to an amount of the charge; and
a transfer transistor that transfers the charge from the charge holding transistor to the floating diffusion layer.

(2) The solid-state imaging element according to (1) described above, further including
a charge discharging transistor that discharges the charge from the photoelectric conversion element.

(3) The solid-state imaging element according to (2) described above, further including:
a scanning circuit that controls the charge discharging transistor to discharge the charge immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing.

(4) The solid-state imaging element according to (3) described above, further including:
a reset transistor that discharges the charge from the floating diffusion layer;
an amplifier transistor that amplifies the voltage; and a selection transistor that outputs a signal of the amplified voltage as a pixel signal in response to a predetermined selection signal.

(5) The solid-state imaging element according to (4) described above, further including a column signal processing unit that processes the pixel signals supplied from each of a predetermined number of columns each including a plurality of pixels, in which the photoelectric conversion element, the charge holding transistor, the backward flow prevention transistor, the floating diffusion layer, the transfer transistor, the charge discharging transistor, the reset transistor, the amplifier transistor, and the selection transistor are arranged in each of the plurality of pixels.

(6) An imaging apparatus including:

a photoelectric conversion element that generates a charge by photoelectric conversion;

a charge holding transistor that holds the charge;

a backward flow prevention transistor that generates a potential barrier between the photoelectric conversion element and the charge holding transistor immediately after the charge is transferred from the photoelectric conversion element to the charge holding transistor;

a floating diffusion layer that accumulates the charge and generates a voltage corresponding to an amount of the charge;

a transfer transistor that transfers the charge from the charge holding transistor to the floating diffusion layer; and a signal processing unit that processes image data including a pixel signal corresponding to the voltage.

(7) The imaging apparatus according to (6) described above, further including:

a charge discharging transistor that discharges the charge from the photoelectric conversion element;

a scanning circuit that controls the charge discharging transistor to discharge the charge from the photoelectric conversion element immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing;

a light emission control unit that causes a lighting device to emit light in response to a predetermined light emission enable signal; and a synchronization control unit that controls disabling the light emission enable signal during a predetermined exposure prohibition period immediately before the second or subsequent exposure start timing, in which the scanning circuit controls the backward flow prevention transistor to transfer the charge during the exposure prohibition period.

(8) The imaging apparatus according to (7) described above, further including an optical system that opens and closes a mechanical shutter in response to a predetermined mechanical shutter enable signal, in which the synchronization control unit further controls disabling the mechanical shutter enable signal during a transfer period of the charge in the exposure prohibition period.

(9) A method of controlling a solid-state imaging element, the method including:

a backward flow prevention procedure in which a backward flow prevention transistor generates a potential barrier between a photoelectric conversion element and a charge holding transistor immediately after a charge is transferred from the photoelectric conversion element to the charge holding transistor; and a transfer procedure in which a transfer transistor transfers the charge from the charge holding transistor to a floating diffusion layer.

REFERENCE SIGNS LIST

100 Imaging apparatus
110 Light emission control unit
120 Synchronization control unit
130 Signal processing unit
140 Optical system
200 Solid-state imaging element
210 Row scanning circuit
220 Pixel array unit
230 Pixel
231 Charge discharging transistor
232 Photoelectric conversion element
233 Backward flow prevention transistor
234 Charge holding transistor
235 Transfer transistor
236 Reset transistor
237 Floating diffusion layer
238 Amplifier transistor
239 Selection transistor
250 System control unit
260 Column signal processing unit
261 ADC
262 CDS processing unit
270 Column scanning circuit
300 Transistor
12031 Imaging unit

The invention claimed is:

1. A solid-state imaging element comprising:
   a photoelectric conversion element that generates a charge by photoelectric conversion;
   a charge holding transistor that holds the charge;
   a backward flow prevention transistor that generates a potential barrier between the photoelectric conversion element and the charge holding transistor immediately after the charge is transferred from the photoelectric conversion element to the charge holding transistor;
   a floating diffusion layer that accumulates the charge and generates a voltage corresponding to an amount of the charge; and
   a transfer transistor that transfers the charge from the charge holding transistor to the floating diffusion layer.

2. The solid-state imaging element according to claim 1, further comprising
   a charge discharging transistor that discharges the charge from the photoelectric conversion element.

3. The solid-state imaging element according to claim 2, further comprising
   a scanning circuit that controls the charge discharging transistor to discharge the charge immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing.

4. The solid-state imaging element according to claim 3, further comprising:
   a reset transistor that discharges the charge from the floating diffusion layer;
   an amplifier transistor that amplifies the voltage; and
   a selection transistor that outputs a signal of the amplified voltage as a pixel signal in response to a predetermined selection signal.

5. The solid-state imaging element according to claim 4, further comprising
   a column signal processing unit that processes the pixel signals supplied from each of a predetermined number of columns each including a plurality of pixels, wherein
   the photoelectric conversion element, the charge holding transistor, the backward flow prevention transistor, the floating diffusion layer, the transfer transistor, the charge discharging transistor, the reset transistor, the amplifier transistor, and the selection transistor are arranged in each of the plurality of pixels.

6. An imaging apparatus comprising:
   a photoelectric conversion element that generates a charge by photoelectric conversion;
   a charge holding transistor that holds the charge;
   a backward flow prevention transistor that generates a potential barrier between the photoelectric conversion element and the charge holding transistor immediately after the charge is transferred from the photoelectric conversion element to the charge holding transistor;
   a floating diffusion layer that accumulates the charge and generates a voltage corresponding to an amount of the charge;
   a transfer transistor that transfers the charge from the charge holding transistor to the floating diffusion layer; and
   a signal processing unit that processes image data including a pixel signal corresponding to the voltage.

7. The imaging apparatus according to claim 6, further comprising:
   a charge discharging transistor that discharges the charge from the photoelectric conversion element;
   a scanning circuit that controls the charge discharging transistor to discharge the charge from the photoelectric conversion element immediately before a first exposure start timing among a plurality of exposure start timings and controls the backward flow prevention transistor to transfer the charge from the photoelectric conversion element to the charge holding transistor without causing the charge discharging transistor to discharge the charge immediately before a second or subsequent exposure start timing;
   a light emission control unit that causes a lighting device to emit light in response to a predetermined light emission enable signal; and
   a synchronization control unit that controls disabling the light emission enable signal during a predetermined exposure prohibition period immediately before the second or subsequent exposure start timing, wherein
   the scanning circuit controls the backward flow prevention transistor to transfer the charge during the exposure prohibition period.

8. The imaging apparatus according to claim 7, further comprising
   an optical system that opens and closes a mechanical shutter in response to a predetermined mechanical shutter enable signal, wherein
   the synchronization control unit further controls disabling the mechanical shutter enable signal during a transfer period of the charge in the exposure prohibition period.

9. A method of controlling a solid-state imaging element, the method comprising:
   a backward flow prevention procedure in which a backward flow prevention transistor generates a potential barrier between a photoelectric conversion element and a charge holding transistor immediately after a charge is transferred from the photoelectric conversion element to the charge holding transistor; and
   a transfer procedure in which a transfer transistor transfers the charge from the charge holding transistor to a floating diffusion layer.

* * * * *